(12) United States Patent
Lobianco et al.

(10) Patent No.: US 9,419,667 B2
(45) Date of Patent: Aug. 16, 2016

(54) APPARATUS AND METHODS RELATED TO CONFORMAL COATING IMPLEMENTED WITH SURFACE MOUNT DEVICES

(71) Applicant: SKYWORKS SOLUTIONS, INC., Woburn, MA (US)

(72) Inventors: Anthony James Lobianco, Irvine, CA (US); Howard E. Chen, Anaheim, CA (US); Robert Francis Darveaux, Gilbert, AZ (US); Hoang Mong Nguyen, Fountain Valley, CA (US); Matthew Sean Read, Rancho Santa Margarita, CA (US); Lori Ann Deorio, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/252,719

(22) Filed: Apr. 14, 2014

(65) Prior Publication Data

US 2014/0307394 A1    Oct. 16, 2014

Related U.S. Application Data

(60) Provisional application No. 61/812,610, filed on Apr. 16, 2013, provisional application No. 61/817,295, filed on Apr. 29, 213.

(51) Int. Cl.
*H04B 1/3827* (2015.01)
*B23K 26/36* (2014.01)
(Continued)

(52) U.S. Cl.
CPC ............ *H04B 1/3838* (2013.01); *B23K 26/362* (2013.01); *B23K 26/365* (2013.01);
(Continued)

(58) Field of Classification Search
CPC .............. H01L 2924/00; H01L 2224/73265; H01L 2224/48227; H01L 2224/48247; H01L 2224/32145; H01L 23/5389; H01L 21/56; H01L 2924/3025; H01L 25/0657; H01L 23/3107; H01L 2224/83; H01L 21/76877; H01L 2224/041; H04B 1/3838; B23K 26/365; B23K 26/385; B23K 26/409; B23K 26/362; B23K 26/40; B23K 26/386; H05K 1/0216; H05K 1/181; Y10T 29/49016; Y10T 29/49002
See application file for complete search history.

(56) References Cited

U.S. PATENT DOCUMENTS

2007/0194433 A1* 8/2007 Suwa et al. .................... 257/700
2008/0315396 A1* 12/2008 Kuhlman ............ H01L 23/3121
257/692

(Continued)

*Primary Examiner* — Yasser A Abdelaziez
*Assistant Examiner* — Farun Lu
(74) *Attorney, Agent, or Firm* — Chang & Hale LLP; James Chang; Tony T. Chen

(57) ABSTRACT

Disclosed are apparatus and methods related to conformal coating of radio-frequency (RF) modules. In some embodiments, a module can include an overmold formed over an RF component mounted on a packaging substrate. The overmold can also cover a surface-mount device (SMD) such as an RF filter implemented as a chip size surface acoustic wave (SAW) device (CSSD). The module can further include a conductive layer formed over the overmold and configured to provide RF shielding functionality for the module. The conductive layer can be electrically connected to a ground plane of the packaging substrate through the SMD. An opening can be formed in the overmold over the SMD; and the conductive layer can conform to the opening to electrically connect the conductive layer with an upper surface of the SMD and thereby facilitate the grounding connection.

20 Claims, 15 Drawing Sheets

(51) Int. Cl.
| | |
|---|---|
| H05K 1/02 | (2006.01) |
| H05K 1/18 | (2006.01) |
| B23K 26/38 | (2014.01) |
| B23K 26/40 | (2014.01) |
| B23K 26/362 | (2014.01) |
| B23K 26/386 | (2014.01) |
| H05K 3/28 | (2006.01) |

(52) U.S. Cl.
CPC .......... B23K26/385 (2013.01); B23K 26/386 (2013.01); B23K 26/40 (2013.01); B23K 26/409 (2013.01); H05K 1/0216 (2013.01); H05K 1/181 (2013.01); *B23K 2203/172* (2015.10); *H01L 2224/4813* (2013.01); *H01L 2224/48227* (2013.01); *H01L 2224/49171* (2013.01); *H01L 2924/19105* (2013.01); *H01L 2924/19107* (2013.01); *H05K 3/288* (2013.01); *H05K 2201/1056* (2013.01); *H05K 2201/10287* (2013.01); *H05K 2203/107* (2013.01); *H05K 2203/1327* (2013.01); *Y10T 29/49002* (2015.01); *Y10T 29/49016* (2015.01)

(56) References Cited

U.S. PATENT DOCUMENTS

| | | | |
|---|---|---|---|
| 2011/0084378 A1* | 4/2011 | Welch | H01L 21/56 257/692 |
| 2013/0037924 A1* | 2/2013 | Lee | H01L 23/66 257/664 |

* cited by examiner

APPARATUS AND METHODS RELATED TO CONFORMAL COATING IMPLEMENTED WITH SURFACE MOUNT DEVICES

CROSS-REFERENCE TO RELATED APPLICATIONS

This application claims priority to U.S. Provisional Application No. 61/812,610 filed Apr. 16, 2013, entitled RADIO-FREQUENCY SHIELD GROUND PATH THROUGH A SURFACE MOUNT DEVICE, and U.S. Provisional Application No. 61/817,295 filed Apr. 29, 2013, entitled TIERED PACKAGE-LEVEL RADIO-FREQUENCY SHIELDING, the disclosure of each of which is hereby expressly incorporated by reference herein in its respective entirety.

BACKGROUND

1. Field

The present disclosure generally relates to shielding of radio-frequency modules.

2. Description of the Related Art

Electromagnetic (EM) fields can be generated from or have an undesirable effect on a region of a radio-frequency (RF) device such as an RF module. Such an EM interference (EMI) can degrade the performance of wireless devices that use such an RF module. Some RF modules can be provided with EM shields to address such performance issues associated with EMI.

SUMMARY

In some implementations, the present disclosure relates to a radio-frequency (RF) module that includes a packaging substrate configured to receive a plurality of components. The RF module further includes an RF component mounted on the packaging substrate and configured to facilitate processing of an RF signal. The RF module further includes an RF shield disposed relative to the RF component. The RF shield is configured to provide shielding for the RF component. The RF shield includes a plurality of shielding-wirebonds and at least one shielding-component. The at least one shielding-component is configured to replace one or more shielding-wirebonds.

In some embodiments, the RF module can further include a conductive racetrack implemented under the plurality of shielding-wirebonds. The conductive racetrack can be electrically connected to the shielding-wirebonds and a ground plane within the packaging substrate. The RF shield can include the at least one shielding-component positioned along a selected edge of the packaging substrate. The selected edge can be substantially free of shielding-wirebond and conductive racetrack. The selected edge can be substantially free of a margin for accommodating the shielding-wirebond and the conductive racetrack, thereby reducing the overall lateral area of the packaging substrate.

In some embodiments, the shielding-component can include an upper surface and a conductive feature implemented on the upper surface. The conductive feature can be electrically connected to a ground plane of the RF shield through the shielding-component. An upper portion the conductive feature on the shielding-component can be in electrical contact with an upper conductive layer of the RF shield. The upper conductive layer can also be in electrical contact with upper portions of the shielding-wirebonds. The RF module can further include an overmold structure that encapsulates the shielding-wirebonds and at least a portion of the shielding-component. The overmold structure can include an upper surface that exposes the upper portions of the shielding-wirebonds and the upper portion of the conductive feature.

In some embodiments, the shielding-component can include a filter device. The filter device can be, for example, a CSSD filter.

In accordance with a number of implementations, the present disclosure relates to a method for fabricating a radio-frequency (RF) module. The method includes providing a packaging substrate configured to receive a plurality of components. The method further includes mounting an RF component on the packaging substrate, with the RF component being configured to facilitate processing of an RF signal. The method further includes forming an RF shield relative to the RF component. The RF shield is configured to provide shielding for the RF component. The RF shield includes a plurality of shielding-wirebonds and at least one shielding-component. The at least one shielding-component is configured to replace one or more shielding-wirebonds.

In some embodiments, forming of the RF shield includes mounting the at least one shielding-component positioned along a selected edge of the packaging substrate. The selected edge can be substantially free of shielding-wirebond. The selected edge can be substantially free of a margin for accommodating the shielding-wirebond, thereby reducing the overall lateral area of the packaging substrate.

In a number of implementations, the present disclosure relates to a wireless device that includes an antenna and a module in communication with the antenna. The module is configured to facilitate either or both of transmission and reception of RF signals through the antenna. The module includes a packaging substrate configured to receive a plurality of components. The module further includes an RF component mounted on the packaging substrate and configured to facilitate processing of an RF signal. The module further includes an RF shield disposed relative to the RF component. The RF shield is configured to provide shielding for the RF component. The RF shield includes a plurality of shielding-wirebonds and at least one shielding-component. The at least one shielding-component is configured to replace one or more shielding-wirebonds.

In accordance with some implementations, the present disclosure relates to a radio-frequency (RF) module that includes a packaging substrate configured to receive a plurality of components and including a ground plane. The RF module further includes a conductive layer implemented over the packaging substrate. The RF module further includes a surface mount device (SMD) mounted on the packaging substrate. The SMD is configured to electrically connect the conductive layer with the ground plane to thereby provide RF shielding between first and second regions about the SMD.

In some embodiments, the first region can be on the packaging substrate, and the second region can be outside of the module. In some embodiments, each of the first and second regions can be on the packaging substrate.

In some embodiments, the SMD can include a functional component. The functional component can include an upper connection feature in electrical contact with the conductive layer, a lower connection feature in electrical contact with the ground plane, and at least one interconnection feature configured to electrically connect the conductive layer with the ground plane. The functional component can include a functional die such that the upper connection feature includes a metal layer formed on one side of the die. The at least one interconnection feature can include at least one through-die conductive via. The lower connection feature can include a contact feature that electrically connects the through-die conductive via with the ground plane. The die can include a radio-frequency (RF) filter such as a chip size surface acoustic wave (SAW) device (CSSD). The die can be mounted on the surface of the packaging substrate in an orientation that is inverted relative to its designed usage orientation.

In some embodiments, the module can be substantially free of shielding-wirebonds. In some embodiments, the module can include a plurality of shielding-wirebonds configured to provide shielding functionality with the SMD.

In a number of implementations, the present disclosure relates to a method for fabricating a radio-frequency (RF) module. The method includes providing a packaging substrate, where the packaging substrate is configured to receive a plurality of components and includes a ground plane. The method further includes mounting a surface mount device (SMD) on the packaging substrate. The method further includes forming or providing a conductive layer over the SMD such that the SMD electrically connects the conductive layer with the ground plane to thereby provide RF shielding between first and second regions about the SMD.

In some embodiments, mounting of the SMD can include inverting the SMD from its designed usage orientation. The SMD can include a conductive feature that faces upward and in electrical contact with the conductive layer in the inverted orientation.

According to some implementations, the present disclosure relates to a wireless device that includes an antenna and a module in communication with the antenna. The module is configured to facilitate processing of an RF signal through the antenna. The module includes a packaging substrate configured to receive a plurality of components and having a ground plane. The module further includes a conductive layer implemented over the packaging substrate. The module further includes a surface mount device (SMD) mounted on the packaging substrate. The SMD is configured to electrically connect the conductive layer with the ground plane to thereby provide RF shielding between first and second regions about the SMD.

In some implementations, the present disclosure relates to a method for forming a conduction path for a radio-frequency (RF) module. The method includes identifying a location of a surface mount device (SMD) mounted on a packaging substrate and encapsulated by an overmold. The method further includes forming an opening through the overmold at the location over the SMD, such that the opening has sufficient depth to expose at least a portion of a surface of the SMD. The method further includes forming a conforming layer over the overmold, such that the conforming layer fills at least a portion of the opening to provide a conduction path between a portion of the conductive layer outside of the opening and the surface of the SMD.

In some embodiments, each of the conforming layer and the exposed portion of the surface of the SMD can include a conductive layer, such that the conduction path includes an electrical conduction path. The forming of the opening can include ablating the overmold with a laser. The forming of the conforming layer can include applying metallic paint.

In accordance with some implementations, the present disclosure relates to a method for fabricating a radio-frequency (RF) module. The method includes providing a packaging substrate configured to receive a plurality of components. The method further includes mounting a surface mount device (SMD) on the packaging substrate, with the SMD including a metal layer that faces upward when mounted. The method further includes forming an overmold over the packaging substrate such that the overmold covers the SMD. The method further includes forming an opening through the overmold at a region over the SMD to expose at least a portion of the metal layer. The method further includes forming a conductive layer over the overmold, such that the conductive layer fills at least a portion of the opening to provide an electrical path between the conductive layer and the metal layer of the functional component.

In some embodiments, the forming of the opening can include ablating the overmold with a laser. The forming of the conductive layer can include applying metallic paint.

In some embodiments, the method can further include forming, prior to forming of the overmold, a shielding-wirebond on the packaging substrate. The shielding-wirebond can have a height that is greater than the height of the SMD. The overmold can have a height that is substantially equal to or greater than the height of the shielding-wirebond.

In some embodiments, the method can further include removing, prior to forming of the opening, an upper portion of the overmold to expose a top portion of the shielding-wirebond but still cover the SMD. The removing of the upper portion of the overmold can include an ablation process such as a micro-ablation process.

In some embodiments, the method can further include removing, after forming of the opening, residue resulting from the formation of the opening. The removing of the residue can also result in additional material being removed from the overmold to thereby further expose the shielding-wirebond. The removing of the residue can include an ablation process such as a micro-ablation process.

In some embodiments, the method can further include cleaning, prior to forming of the conductive layer, the exposed surfaces of the overmold and the metal layer of the SMD.

In some embodiments, the SMD can include a functional component. The functional component can be configured to facilitate processing of an RF signal.

According to a number of implementations, the present disclosure relates to a radio-frequency (RF) module that includes a packaging substrate configured to receive a plurality of components, and a surface mound device (SMD) mounted on the packaging substrate. The SMD includes a metal layer that faces upward when mounted. The RF module further includes an overmold formed over the packaging substrate, with the overmold being dimensioned to cover the SMD. The RF module further includes an opening defined by the overmold at a region over the SMD, with the opening having a depth sufficient to expose at least a portion of the metal layer. The RF module further includes a conductive layer formed over the overmold. The conductive layer is configured to fill at least a portion of the opening to provide an electrical path between the conductive layer and the metal layer of the SMD.

In some embodiments, the SMD can include a functional component. The functional component can include an RF filter formed on a die. The RF filter can include a plurality of through-die conductive vias, with at least some of the conductive vias being electrically connected to the metal layer and contact features on a lower side of the RF filter. The contact features on the lower side of the RF filter can be electrically connected to a ground plane of the packaging substrate, such that the conductive layer above the overmold is electrically connected to the ground plane through the RF filter. In some embodiments, the RF module can further include a plurality of shielding-wirebonds disposed relative to the RF filter, with the shielding-wirebonds being configured to facilitate electrical connections between the conductive layer and the ground plane.

In some embodiments, the opening can include a side wall having a chamfer profile such that an angle between the side wall and a surface of the overmold has a value greater than 90 degrees to thereby facilitate an improved conformity as the conductive layer transitions between the opening and the surface of the overmold. The conductive layer can include, for example, a layer formed by metallic paint.

In a number of implementations, the present disclosure relates to a wireless device having an antenna and a module in communication with the antenna. The module is configured to facilitate either or both of transmission and reception of RF signals through the antenna. The module includes a packaging substrate configured to receive a plurality of components. The module further includes a surface mount device (SMD) mounted on the packaging substrate. The SMD includes a metal layer that faces upward when mounted. The module further includes an overmold formed over the packaging substrate, with the overmold being dimensioned to cover the SMD. The module further includes an opening defined by the overmold at a region over the SMD, such that the opening has a depth sufficient to expose at least a portion of the metal layer. The module further includes a conductive layer formed over the overmold. The conductive layer is configured to fill at least a portion of the opening to provide an electrical path between the conductive layer and the metal layer of the SMD.

In some embodiments, the SMD can be a functional component. The functional component include, for example, an RF filter. The wireless device can be a cellular phone configured to operate in a cellular band associated with the RF filter.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 14/252,717, titled "APPARATUS AND METHODS RELATED TO GROUND PATHS IMPLEMENTED WITH SURFACE MOUNT DEVICES," filed on even date herewith and hereby incorporated by reference herein in its entirety.

DETAILED DESCRIPTION OF SOME EMBODIMENTS

The headings provided herein, if any, are for convenience only and do not necessarily affect the scope or meaning of the claimed invention.

Disclosed herein are various devices and methods for providing radio-frequency (RF) isolation or shielding for an active or a passive RF device. For the purpose of description, it will be understood that RF can include electromagnetic signals having a frequency or a range of frequencies associated with wireless devices. RF can also include electromagnetic signals that radiate within an electronic device, whether or not such an electronic device operates as a wireless device. RF can also include signals or noises typically associated with electromagnetic interference (EMI) effects.

For the purpose of description it will be understood that such an RF device can include a device configured to operate at an RF range to facilitate transmitting and/or receiving of RF signals, and a device that can influence another device by, or be influenced by, RF signals or noises. Non-limiting examples of such an RF device can include a semiconductor die with or without an RF circuitry. Non-limiting examples of such an RF-related device can include discrete devices such as inductors and capacitors, and even a length of a conductor.

For the purpose of description, it will be understood that the terms isolation and shielding can be used interchangeably, depending on the context of usage. For example, an RF device being shielded can involve a situation where an RF signal from another source is being partially or fully blocked. In another example, an RF device being isolated can involve a situation where an RF signal (e.g., noise and/or actively generated signal) is being partially or fully blocked from reaching another device. Unless the context of usage specifically states otherwise, it will be understood that each of the terms shielding and isolation can include either or both of the foregoing functionalities.

Figure 1:
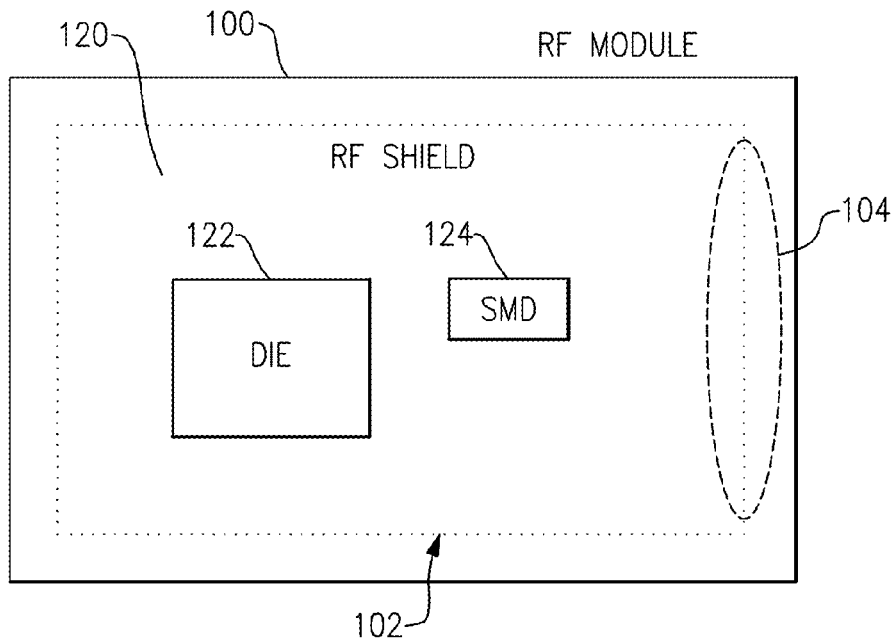
FIG. 1 depicts a radio-frequency (RF) module having an RF shield.

FIG. 1 depicts an RF module 100 having an RF shield 102. The RF shield 102 is shown to include a portion 104 where one or more components can be positioned and/or configured to provide shielding functionality. Various examples of how such a component-portion can be configured are described herein in greater detail.

In FIG. 1, the example module 100 can include a packaging substrate 120 (e.g., a laminate substrate) configured to receive a plurality of components. Such components can include, for example, a die 122 having an integrated circuit (IC) such as an RF circuit. One or more surface mount devices (SMDs) 124 can also be mounted on the packaging substrate 120 to facilitate various functionalities of the module 100. In some embodiments, the module 100 can further include an overmold structure that encapsulates some or all of the RF shield 102, component-portion 104, die 122, and SMD 124.

Figure 2:
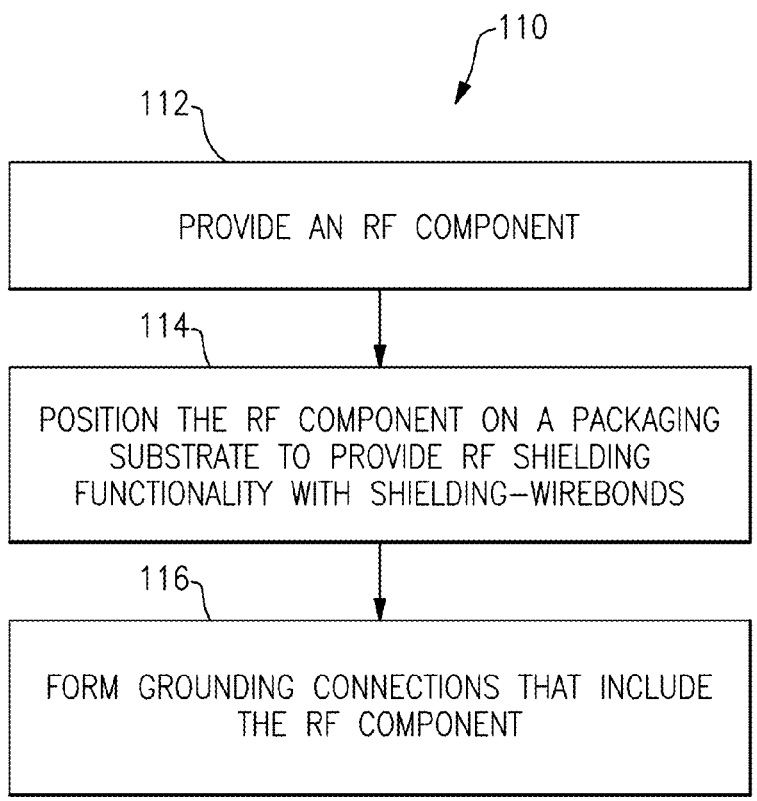
FIG. 2 shows a process that can be implemented to fabricate an RF module having one or more features as described herein.

FIG. 2 shows a process 110 that can be implemented to fabricate a module (e.g., module 100 of FIG. 1) having one or more features as described herein. In block 112, an RF component can be provided. In block 114, the RF component can be positioned and mounted on a packaging substrate to provide RF shielding functionality along with shielding-wirebonds. Such shielding-wirebonds can be formed before or after the mounting of the RF-component. Examples of such positioning of the RF-component are described herein in greater detail. In block 116, one or more grounding connections that facilitate the RF-shielding functionality can be formed. Examples of such grounding connections are described herein in greater detail. Although various examples are described herein in the context of shielding-wirebonds, it will be understood that one or more features of the present disclosure can also be implemented without such shielding-wirebonds, with other types of RF-shielding technologies, without any other shielding technologies, or any combination thereof.

Figure 3A:
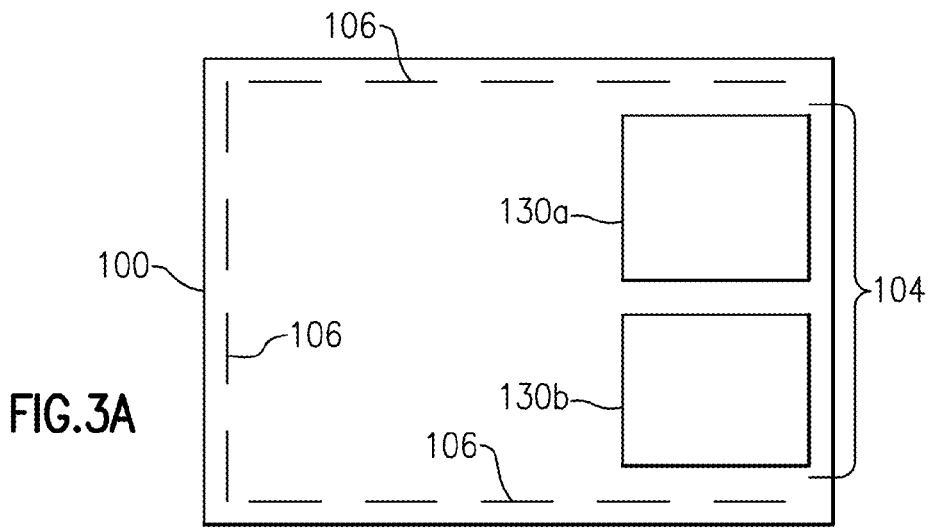
FIGS. 3A-3C show examples of how one or more RF components can be positioned on an RF module to provide shielding functionality.
Figure 3B:
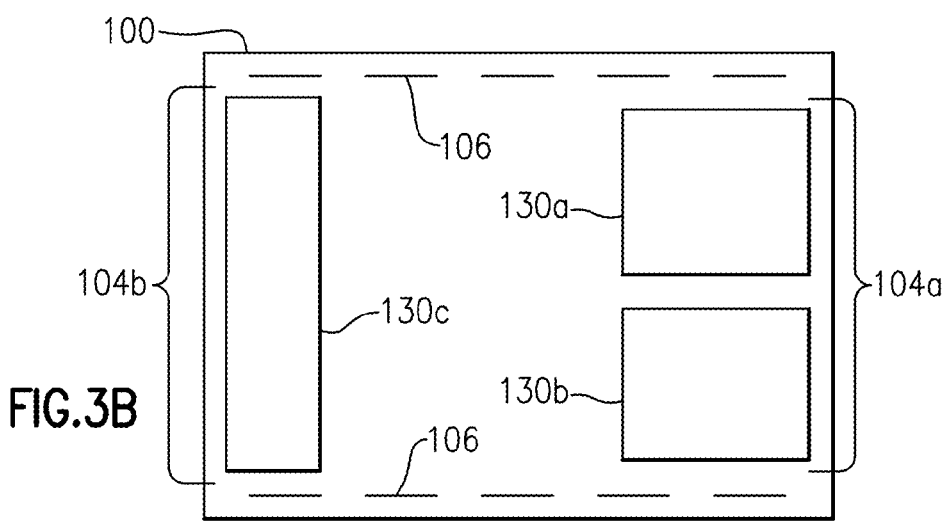
Figure 3C:
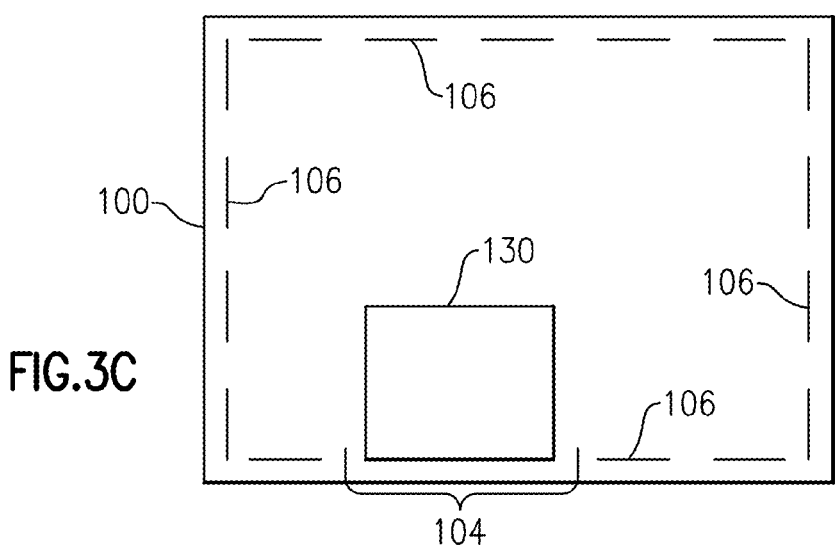

FIGS. 3A-3C show non-limiting examples of how one or more RF components 130 can be positioned to form one or more shielding-portions 104 at or near a periphery of a module 100. Such shielding-portions, along with a plurality of shielding-wirebonds 106, can form an RF shield and provide RF shielding between locations inside and outside of the RF shield. Although described in the context of RF shielding of a region generally surrounded by the RF shield, it will be understood that one or more features of the present disclosure can also be implemented so as to provide RF shielding between two regions that are both on the module 100.

FIG. 3A shows that in some embodiments, a shielding-portion 104 can be provided on a selected side along a perimeter of a module 100. The remaining sides of the perimeter can be provided with a plurality of shielding-wirebonds 106. The example shielding-portion 104 is shown to include first and second components 130a, 130b. There can be more or less number of components in the shielding-portion 104. Such components can be active RF components, passive components, or some combination thereof.

FIG. 3B shows that in some embodiments, more than one side of a module 100 can be provided with shielding-portions 104a, 104b. In the example, the first shielding-portion 104a is shown to include first and second components 130a, 130b; and the second shielding-portion 104b is shown to include one component 130c. There can be more or less number of components in each of the shielding-portions 104a, 104b. Such components can be active RF components, passive components, or some combination thereof. In the example of FIG. 3B, the remaining sides of the perimeter can be provided with a plurality of shielding-wirebonds 106.

FIG. 3C shows that in some embodiments, a shielding-portion 104 does not necessarily need to occupy an entire side. For example, a shielding-portion 104 having a component 130 is shown to be positioned along a selected side, with shielding-wirebonds 106 on both left and right of the component 130. It will be understood that in some embodiments, such shielding-wirebonds 106 can be provided on the left or right of the component 130. Further, a given side of a module can be provided with more than one components (active, passive, or some combination thereof); and such components can be positioned with or without one or more shielding-wirebonds along that side.

In some implementations, use of one or more shielding-components in place of one or more shielding-wirebonds can provide advantageous features such as a reduction in area of modules. For example, consider an RF shielding configuration where shielding-wirebonds are connected to a ground plane through a conductive racetrack that runs along substantially the entire perimeter of a module. Such a configuration typically needs a margin along the perimeter to accommodate the conductive racetrack and the shielding-wirebonds. Thus, by providing one or more components along a given side of a module and forming grounding connections facilitated by such components, the racetrack and the corresponding shielding-wirebonds can be removed from the given side. Since the margin is no longer needed along the given side, that portion of the module can be removed thereby reducing the overall lateral area of the module.

Figure 4:
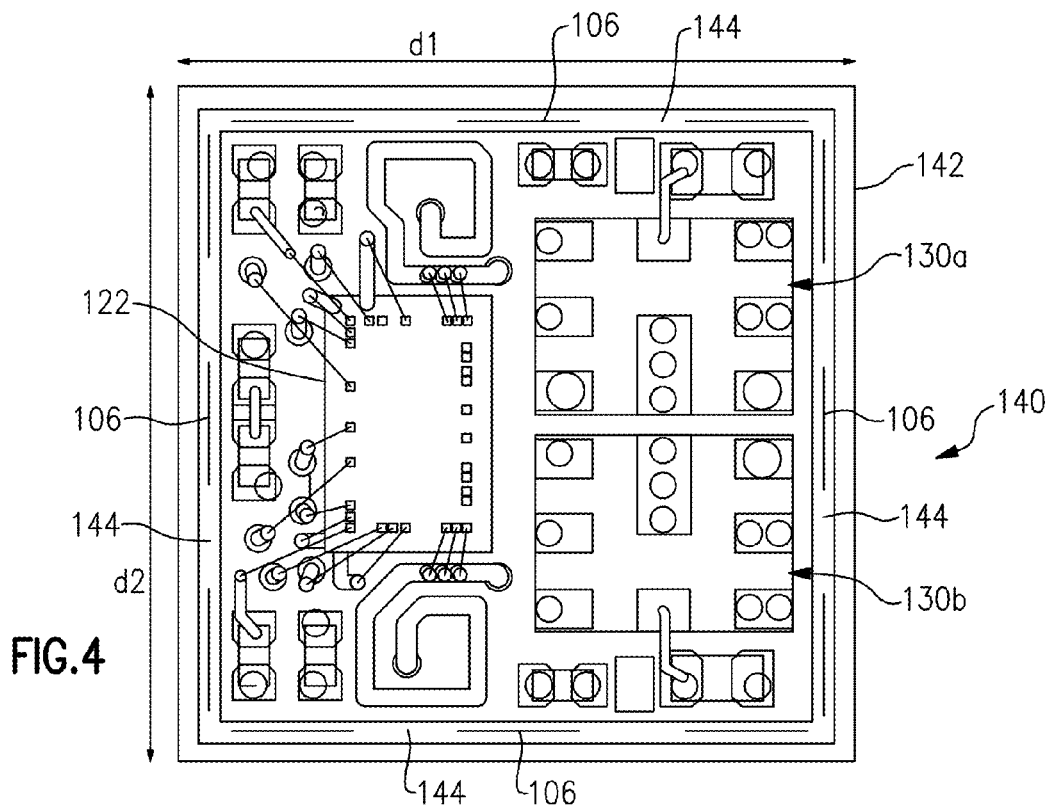
FIG. 4 shows an example module having a conductive racetrack that extends around the entire perimeter of a packaging substrate, and shielding wirebonds implemented on such a conductive racetrack.

By way of examples, FIG. 4 shows an example module 140 having a conductive racetrack 144 that extends around the entire perimeter of a packaging substrate 142. A plurality of shielding-wirebonds 106 are shown to be provided along the lines defined by the racetrack 144. Within the boundary defined by the racetrack 144 are shown various components, including an integrated circuit (IC) die 122 and filters 130a, 130b. As described herein, desired or needed margins outside of the racetrack 144 contribute to the overall lateral dimensions of d1×d2 for the packaging substrate 142.

Figure 5:
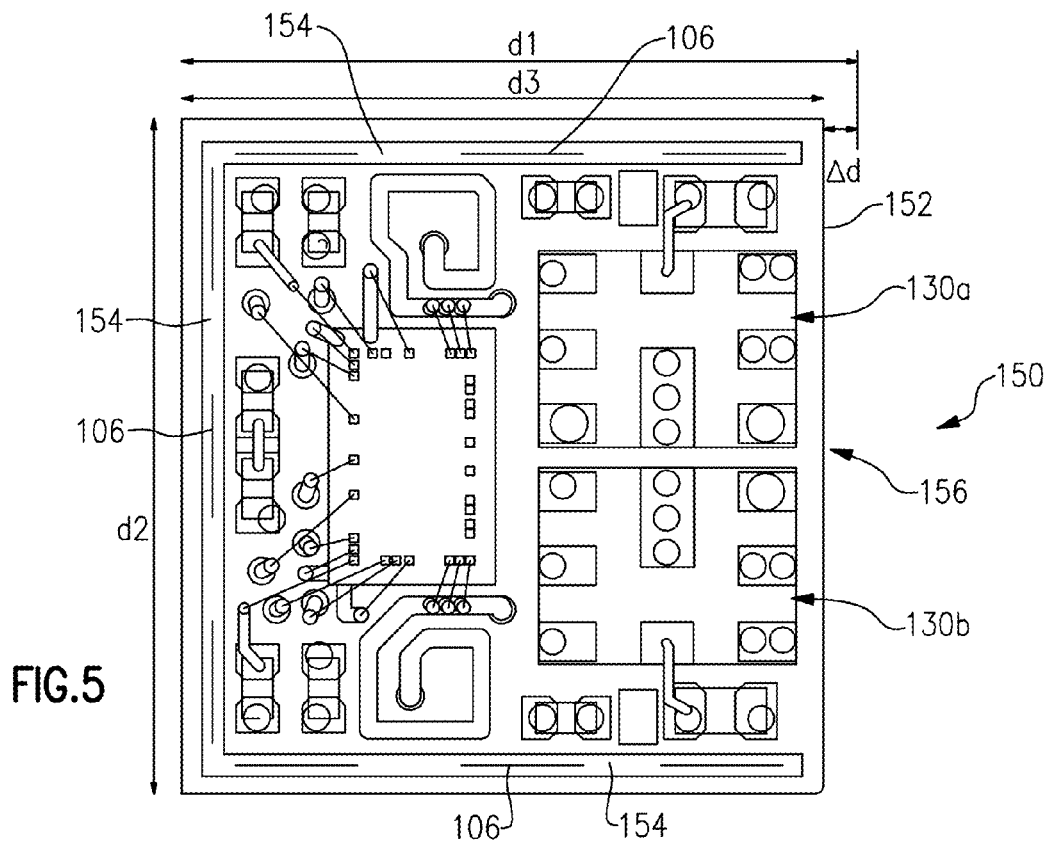
FIG. 5 shows an example module that includes similar components as in FIG. 4; however, one side of the module is shielded by RF components, thereby allowing a portion of the racetrack and the corresponding shielding wirebonds to be omitted.

In FIG. 5, an example module 150 is shown to include similar components (e.g., IC die 122 and filters 130a, 130b) as in FIG. 4. However, while three of the four sides of a packaging substrate 152 include a racetrack 154 and a plurality of shielding-wirebonds 106, the fourth side 156 (right side in the example of FIG. 5) of the packaging substrate 152 does not include a racetrack or shielding-wirebonds. Accordingly, the fourth side 156 does not need a margin that are present in the other three sides. Thus, the region that would have been needed for the fourth-side racetrack and shielding wirebonds can be removed from the packaging substrate 152.

In the particular example of FIG. 5, the dimension d2 can be generally the same as the example of FIG. 4. However, the dimension d1 of FIG. 4 can now be reduced by Δd to yield a reduced dimension d3. In some embodiments, such a reduced amount Δd can be generally the area needed to implement the fourth-side racetrack and corresponding shielding-wirebonds.

In the particular example of FIG. 5, the filters 130a, 130b can be, for example, chip size SAW (surface acoustic wave) devices (CSSDs) such as commercially available Taiyo Yuden CSSD filters. Each of filters can include or be provided with a grounded top surface, and such a grounded top surface can be utilized to form one or more electrical connections to facilitate RF shielding functionality.

Figure 6A:
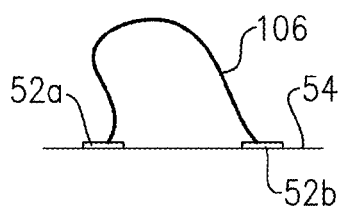
FIGS. 6A-6C show examples of shielding-wirebonds that can be implemented in an RF module.
Figure 6B:
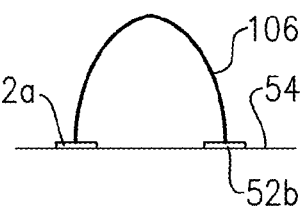
Figure 6C:
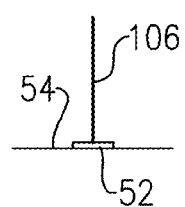

In some implementations, RF shielding-wirebonds 106 utilized along with shielding-components 130 as described herein can be configured in a number of ways. FIGS. 6A-6C show non-limiting examples of such shielding-wirebonds 106. In FIG. 6A, a shielding-wirebond 106 having a deformable configuration is shown to be formed on bond pads 52a, 52b that are on a packaging substrate 54 (e.g., laminate substrate). Additional details concerning such a wirebond configuration are available in International Publication No. WO 2010/014103 (International Application No. PCT/US2008/071832, filed on Jul. 31, 2008, titled "SEMICONDUCTOR PACKAGE WITH INTEGRATED INTERFERENCE SHIELDING AND METHOD OF MANUFACTURE THEREOF") the disclosure of which is incorporated herein by reference in its entirety.

In FIG. 6B, an arch shaped shielding-wirebond 50 is shown to be formed on bond pads 52a, 52b that are on a packaging substrate 54 (e.g., laminate substrate). Additional details concerning such a wirebond configuration are available in U.S. Pat. No. 8,399,972, titled "OVERMOLDED SEMICONDUCTOR PACKAGE WITH A WIREBOND CAGE FOR EMI SHIELDING" the disclosure of which is incorporated herein by reference in its entirety.

FIG. 6C shows that in some embodiments, shielding-wirebonds do not need to be curved or have ends that begin and end on the packaging substrate. A wirebond structure 106 that begins on the packaging substrate 54 and ends at a location above the packaging substrate 54 is shown to be formed on a bond pad 52. Additional details concerning such a wirebond configuration are available in the above-referenced U.S. Pat. No. 8,399,972. Other configurations of shielding-wirebonds can also be utilized.

FIGS. 7A-7D show various non-limiting examples of how a grounding connection can be made through one or more shielding-components 130. In an example configuration 160 of FIG. 7A, a shielding-component 130 (e.g., an RF filter) is depicted as being mounted on a packaging substrate 56 through contact pads 162a, 162b. At least one of such contact pads can be a grounding pad electrically connected to a ground plane within the packaging substrate. An upper surface of the shielding-component 130 is shown to include a conductive layer 164. In some embodiments, such a conductive layer 164 can be electrically connected to the grounding pad, and thereby to the ground plane.

Positioned relative to the shielding-component 130 is an example shielding-wirebond 106 formed on bond pads 52a, 52b. As described in the above-referenced U.S. Pat. No. 8,399,972, such bonding pads can be electrically connected to the ground plane within the packaging substrate. As also described in the above-referenced U.S. Pat. No. 8,399,972, an upper portion 58 of the shielding-wirebond 106 can be exposed from an overmold structure 56 so as to allow formation of an electrical connection with a conductive layer 60. Such an arrangement of the conductive layer 60, the shielding-wirebond 106, and the ground plane allows shielding of RF signals, RF noise, electromagnetic interference (EMI), etc. between an inner region and an outer region, and/or between selected regions within the boundary of a module.

Figure 7A:
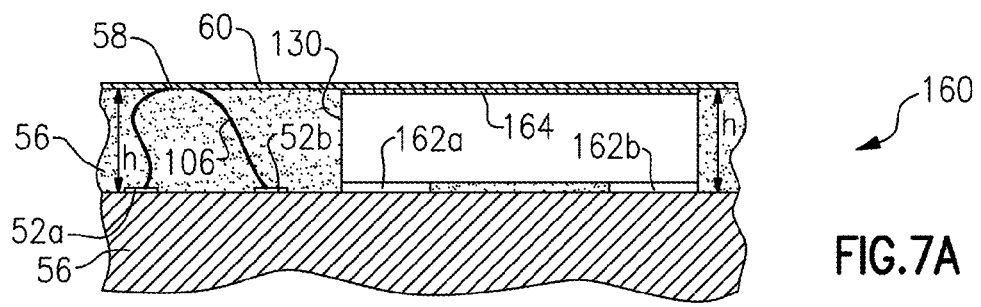
FIGS. 7A-7D show various examples of how a grounding connection can be made through one or more shielding-components.

As shown in FIG. 7A, the conductive layer 60 can be in electrical contact with the conductive layer 164 of the shielding-component 130. Accordingly, the foregoing shielding arrangement can be extended to a region where the shielding-component 130 replaces one or more shielding-wirebonds 106.

In the example shown, the height of the upper surface of the conductive layer 164 is depicted as being h. In some implementations, the shielding-wirebond 106 can be dimensioned appropriately so that its height is also approximately h.

Figure 7B:
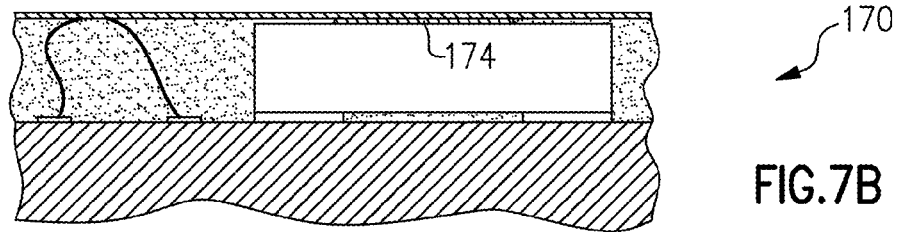

In the example of FIG. 7A, the conductive layer 164 is depicted as a single layer that extends laterally to substantially cover the shielding-component 130. FIG. 7B shows that in some embodiments, such a conductive layer does not need to cover the entire upper portion of the shielding-component 130. In an example configuration 170, a conductive layer 174 is shown to cover only a portion of the upper surface of the shielding-component 130. The remaining areas are shown to be covered by the overmold structure.

In some embodiments, each of the conductive layers 164, 174 of FIGS. 7A and 7B can be a single contiguous piece. In some embodiments, each of the conductive layers 164, 174 can include a plurality of conductive features electrically connected to a grounding pad. Other configurations can also be implemented.

Figure 7C:
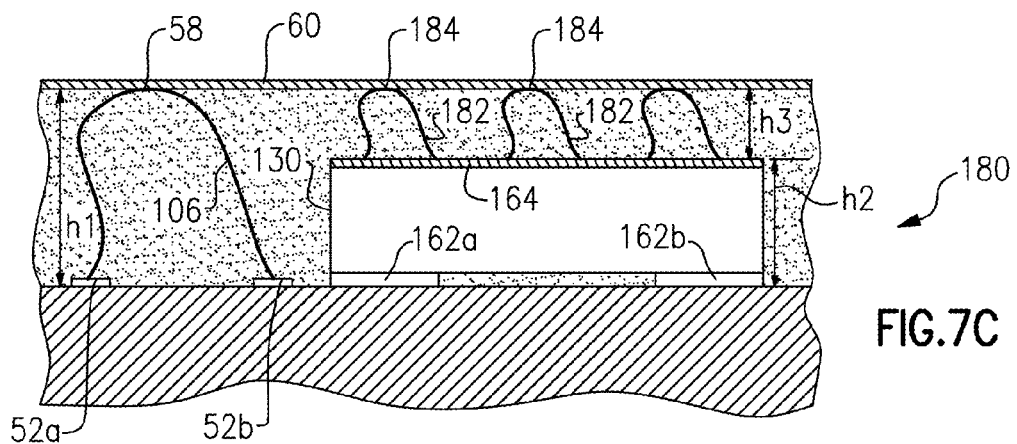

FIG. 7C shows that in some embodiments, heights of a shielding-wirebond and a shielding-component do not need to be the same. In an example configuration 180, a shielding-wirebond 106 is depicted as having a height of h1, and an upper surface of a conductive layer 164 above a shielding-component 130 is depicted as having a height of h2 which is less than h1. Such a configuration can arise, for example, when the shielding-component 130 has a relatively low profile.

If the height difference h3 (h1 minus h2) is sufficiently large, it may not be desirable or practical to form an electrical connection between the conductive layers 60 and 164 through a solid conductive layer. To form an electrical connection, one or more reduced-size shielding-wirebonds 182 can be provided on the conductive layer 164, such that top portions 184 of the wirebonds 182 are in electrical contact with the conductive layer 60. In some embodiments, the shape of the reduced-size shielding-wirebonds 182 can be similar to that of the shielding-wirebond 106. In some embodiments, the two shapes can be different.

Figure 7D:
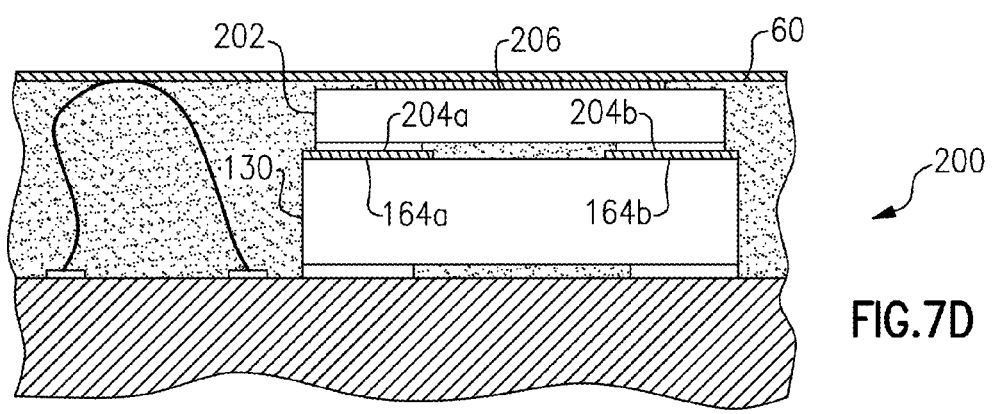

FIG. 7D shows that in some embodiments, the extra height which is bridged by a plurality of reduced-size shielding-wirebonds 182 in the example of FIG. 7C, can also be occupied in other manners. In an example configuration 200, an additional shielding-component 202 is shown to be positioned above the shielding-component 130. A conductive layer 206 on an upper surface of the additional component 202 is shown to be in electrical contact with the conductive layer 60, and the conductive layer 206 can be electrically connected to a grounding pad (e.g., either or both of pads 204a, 204b). The pads 204a, 204b are shown to be in electrical contact with corresponding conductive layers 164a, 164b. Either or both of the conductive layers 164a, 164b can be electrically connected to a ground plane as described herein.

In some embodiments, the additional component 202 can be an active or passive device that facilitates the operation of the module. In some embodiments, the additional component 202 can be a dummy device configured to provide the foregoing electrical bridge between the conductive layers 60 and 164.

In the various examples described in reference to FIGS. 1-7, RF shielding functionality includes some combination of one or more shielding-components (130) and a plurality of shielding-wirebonds (106). Further, some of such combinations are described in the context of generally surrounding a region on a packaging substrate so as to provide RF shielding functionality between inside and outside of such a region.

As described herein, it will be understood that one or more features associated with use of shielding-components (130) can be implemented in other configurations. For example, one or more shielding-components (130) can be implemented (with or without shielding-wirebonds) to provide RF shielding between first and second regions of the same module without having to define a generally enclosed region. In configurations where such intra-module RF shielding does not include shielding-wirebonds, use of needed components as shielding-components and absence of shielding-wirebonds can make the packaging process more efficient and cost-effective.

Figure 8A:
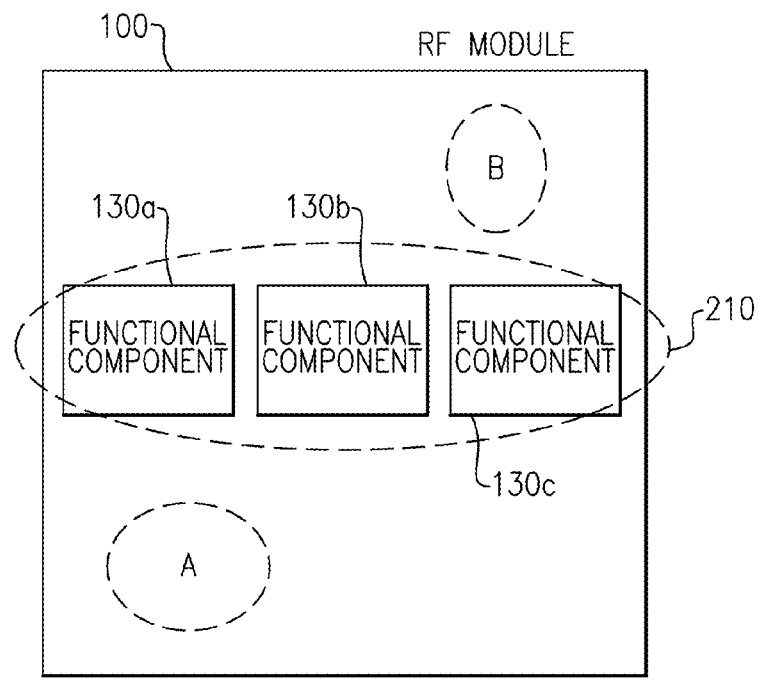
FIG. 8A shows an example configuration of a module where intra-module RF shielding can be implemented with one or more shielding-components.

FIG. 8A shows an example configuration of a module 100 where intra-module RF shielding can be implemented with one or more shielding-components 130. The three example shielding-components 130a, 130b, 130c are shown to provide an RF shield 210 between a first region "A" and a second region "B," with both regions being parts of the same module 100. In the example shown, the module 100 does not include any shielding-wirebonds. However, shielding-wirebonds can be implemented to provide, for example, RF-shielding between locations within and outside of the module 100.

Figure 8B:
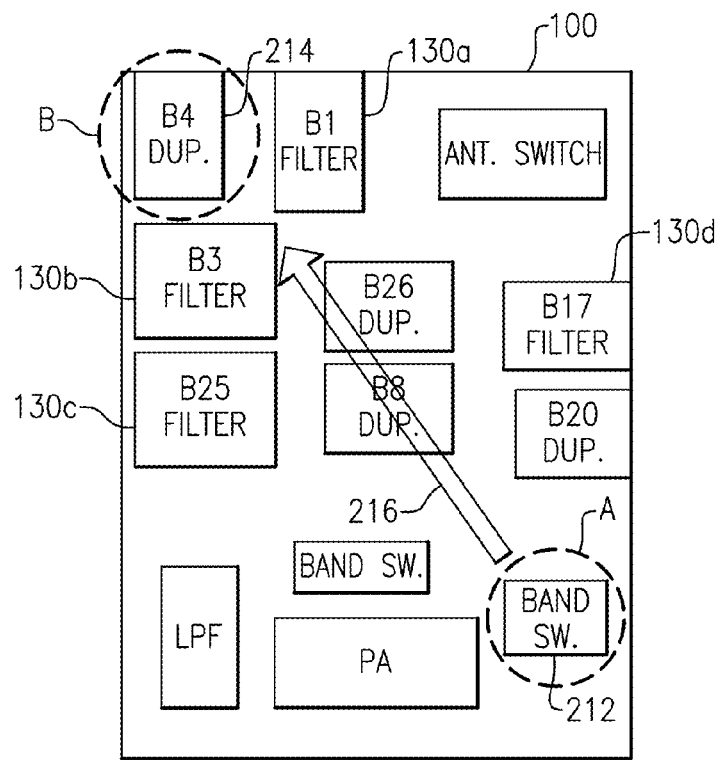
FIG. 8B shows a more specific example of the shielding configuration of FIG. 8A.

FIG. 8B shows a more specific example of the intra-module shielding configuration of FIG. 8A. An example front-end module (FEM) 100 is shown to include a power amplifier (PA) die having a PA circuit configured to provide multi-mode multi-band (MMMB) capability. Operation of such a PA circuit in different cellular bands and/or different modes can be facilitated by one or more band switches, various filters, various duplexers, and an antenna switch.

In the example shown in FIG. 8B, suppose that a band switch 212 located at one region (e.g., region A) radiates RF signal and/or noise to impact operation of a duplexer 214 (e.g., a B4 band duplexer) located at another region (e.g., region B). Such known pair of components can be separated to the extent possible or practical within the module; however, it may be desirable to shield the B4 duplexer 214 from the radiated RF signal/noise from the band switch 212.

In some embodiments, RF filter devices can be utilized as shielding-components. For example, some or all of filters such as B1 filter 130a, B3 filter 130b, B25 filter 130c and B17 filter can be positioned and configured as described herein to provide intra-module shielding functionality. In the example shown in FIG. 8, the B1 filter 130a and the B3 filter 130b can be positioned about the B4 duplexer 214 so as to provide RF shielding from the influence of the RF radiation (depicted as an arrow 216) from the band switch 212.

In some embodiments, some or all of the shielding-components 130 of FIGS. 8A and 8B can be functional components. For the purpose of description, it will be understood that a functional component can include a device (active or passive) that is part of the module's RF design and therefore provides some RF-related function. As described herein, a filter device such as a CSSD filter can be such a functional component. It will also be understood that a functional component can include a device (active or passive), which may or may not be part of the module's RF design, that includes connection features through the device, about the device, or some combination thereof. For example, and as described herein in greater detail, such a device can include through-substrate-vias that provide, or are capable of providing, electrical connection paths between two opposing sides of the device. It will be understood that the foregoing components can also be utilized as the shielding-components described herein in reference to FIGS. 1-7.

Figure 9A:
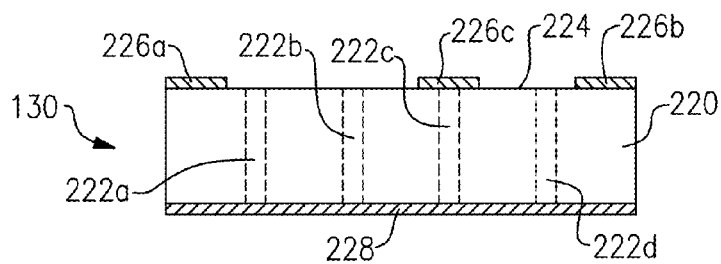
FIG. 9A depicts a sectional view of an example functional component that can be utilized as a shielding-component of FIGS. 8A and 8B.
Figure 9B:
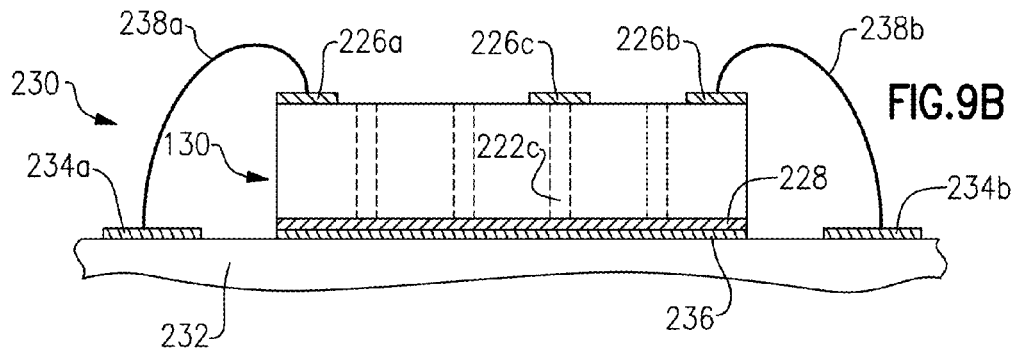
FIG. 9B shows the functional component of FIG. 9A mounted on a packaging substrate in an intended usage orientation.

FIG. 9A depicts a sectional view of an example functional component 130 that can be utilized as one of the functional components of FIGS. 8A and 8B. In FIG. 9A, the functional component 130 is oriented in its intended conventional usage, where a metal layer 228 on one side of a die substrate 220 is facing down for mounting to a packaging substrate 232 (FIG. 9B). In some embodiments, such a metal layer (228) may be utilized during die fabrication; however, the metal layer 228 may or may not be utilized in the finalized die. In some embodiments, the metal layer 228 can function as a ground for the die.

The other side of the die substrate 220 is shown to include a plurality of electrical contact pads 226a, 226b, 226c. Some of such contact pads (e.g., 226a, 226b) can be utilized for signals, power, etc.; and some (e.g., 226c) can be utilized as a grounding contact.

As further shown in FIG. 9A, the functional component 130 can include a plurality of through-die vias 222a, 222b, 222c, 222d. In some embodiments, such vias can be configured to provide, for example, electrical connection between the two sides of the die, heat conduction path(s), or some combination thereof. In some embodiments, some of such vias may be utilized during die fabrication, but may be unused in the finalized die. In the example shown, via 222c is shown to provide an electrical connection between the contact pad 226c and the metal layer 228 (e.g., to provide a grounding connection). The other vias (222a, 222b, 222d) can be utilized to conduct heat to the metal layer to be dissipated away from the die.

In an example mounted configuration 230 of FIG. 9B, the metal layer 228 can be secured (e.g., soldered) to a grounding pad 236 so as to physically mount the die and provide electrical connection between the die's ground to the module's ground. Non-ground contact pads (e.g., 226a, 226b) of the die can be electrically connected to their respective contact pads (e.g., 234a, 234b) on the packaging substrate 232.

Figure 10A:
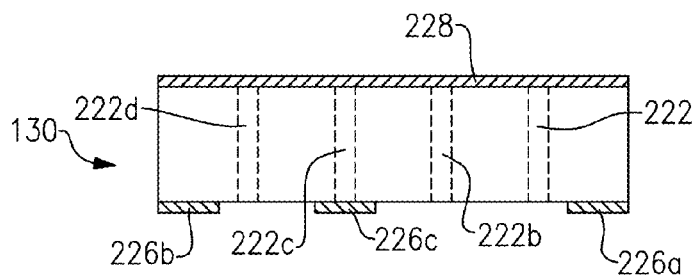
FIG. 10A shows that in some implementations, a functional component similar to the die of FIG. 9A can be inverted for mounting.
Figure 10B:
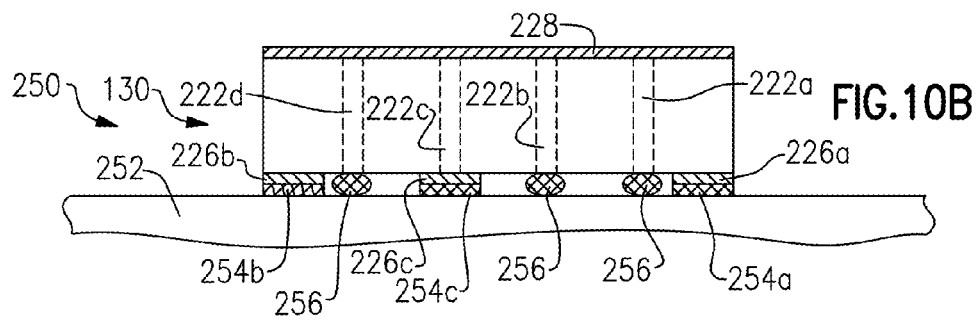
FIG. 10B shows a mounted configuration where the inverted die is mounted on a packaging substrate.

FIG. 10A shows that in some implementations, a functional component 130 substantially the same or similar to the die of FIG. 9A can be inverted so that the metal layer 228 now faces up. FIG. 10B shows a mounted configuration where the inverted die is mounted on a packaging substrate 252. In some embodiments, the packaging substrate 252 can be configured with contact pads (e.g., 254a, 254b, 254c) to facilitate physical mounting (e.g., by solders) and electrical connections with their respective contact pads (e.g., 226a, 226b, 226c) of the die. The contact pads 254a, 254b, 254c can be electrically connected to their respective module-terminals or module-ground through various connection features (not shown) within the packaging substrate 252 (e.g., a laminate substrate).

As further shown in FIG. 10B, the vias (e.g., 222a, 222b, 222d) that are not connected in the foregoing manner can be electrically grounded by, for example, one or more ball joints 256 that are in turn electrically connected (not shown) to the module-ground. In some embodiments, such a module-ground can include one or more ground planes that provide RF shielding functionality below the surface of the packaging substrate 252.

Figure 10C:
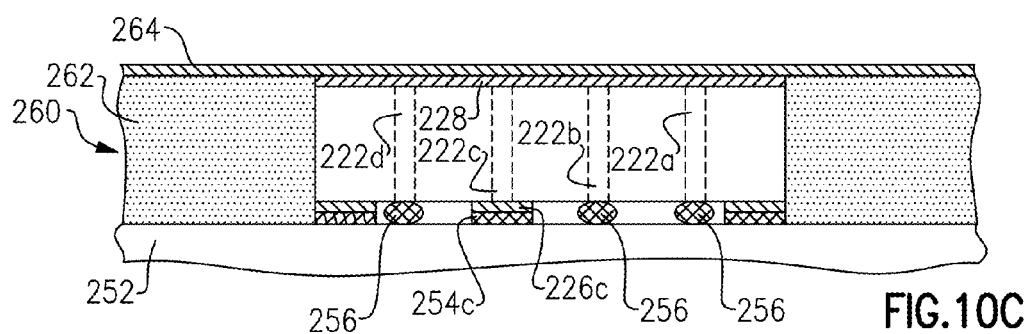
FIG. 10C shows an example packaged configuration where overmold material is shown to laterally surround the mounted die of FIG. 10B.

FIG. 10C shows an example packaged configuration 260 where an overmold material 262 is shown to laterally surround the mounted die. Further, a metal layer 264 is shown to be formed or provided over the overmold 262 (e.g., as described in reference to FIG. 7) and in electrical contact with the metal layer 228 of the die.

As shown in FIG. 10C, the metal layer 264 is in electrical contact with the grounding plane(s) within the packaging substrate 252 through the metal layer 228 of the die, one or more of the through-die conductive vias (e.g., 222a, 222b, 222c, 222d), and their respective die-to-packaging substrate connection features (e.g., 256, 226c, 254c). As shown, the conductive vias 222a, 222b, 222c, 222d can provide lateral RF shielding functionality (e.g., intra-module shielding between regions A and B in FIGS. 8A and 8B) which can be enhanced by the electrically connected upper (metal layer 264) and lower (grounding plane(s)) shielding planes.

In the examples shown in FIGS. 10A-10C, one can see that the functional component 130 (e.g., a CSSD filter die) can provide dual functionalities—one for filtering, and another for providing RF shielding. It is also noted that the inverted-mounting configuration can also remove the need to electrically connect the contact pads of the functional component 130 with connection-wirebonds. In some situations, such absence of connection-wirebonds can be advantageous. In some embodiments, and as described herein, a shielding-component as described herein can be a component that provides or facilitates an electrical connection for shielding functionality, as well as be a functional part of a circuit associated with the corresponding module. Use of such a shielding-component for dual purpose can allow, for example, reduction or optimization of space needed by the module.

Figure 11A:
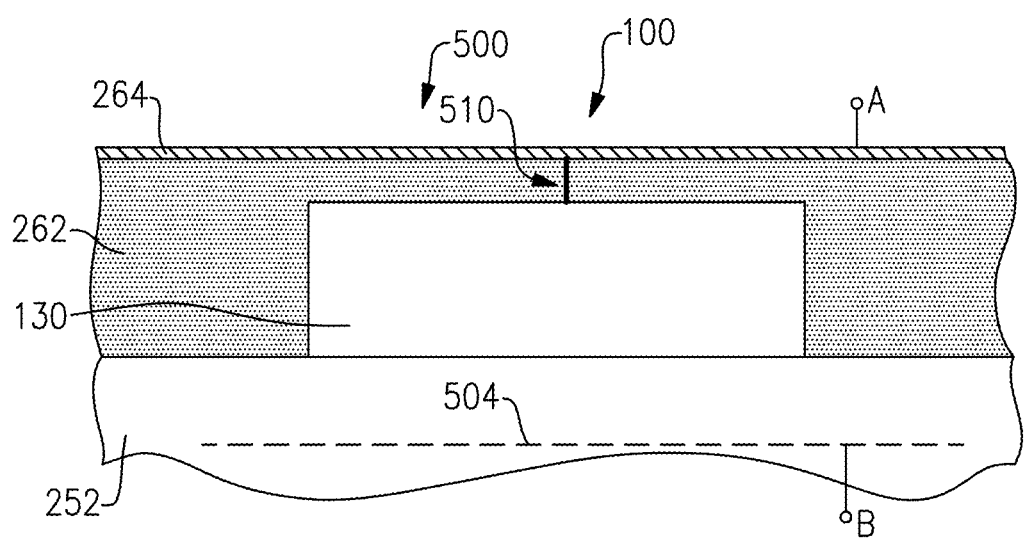
FIG. 11A depicts an example configuration for providing an electrical connection between a conductive layer on an RF module and a shielding-component.
Figure 11B:
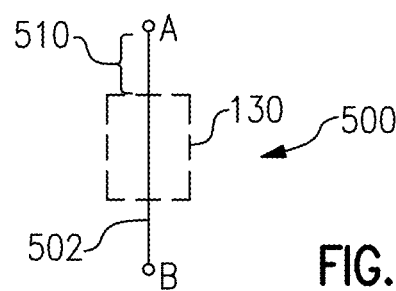
FIG. 11B depicts a shielding electrical path that can be provided by the configuration of FIG. 11A.

As described herein, there may be situations (e.g., examples of FIGS. 7C and 7D) where the height of an overmold structure is greater than the height of a shielding-component. FIG. 11A depicts an example configuration 500 for providing an electrical connection 510 between a conductive layer 264 on an RF module 100 and a shielding-component 130. As described herein, such an electrical connection can be formed through a layer of an overmold structure 262 that encapsulates the shielding-component 130. The shielding-component 130 is shown to be mounted on a packaging substrate 252 that includes a ground plane 504. With the electrical connection 510 between an electrical node A associated with the conductive layer 264 and the shielding-component 130, an electrical path 502 (see FIG. 11B) can be formed between node A and node B associated with the ground plane 504. Such an electrical path can include the conductive layer 264, the electrical connection 510, one or more electrical paths on, around and/or through the shielding-component 130, one or more electrical connections between the shielding-component 130 and the packaging substrate 252, and one or more electrical connections within the packaging substrate 252.

In some embodiments, the shielding-component 130 can be a functional component such as an RF filter device. Examples of such a functional component and use of the same for providing RF shielding functionalities are described herein in greater detail.

FIGS. 12A-12E show an example of how an opening formed through an overmold layer can allow formation of an electrical connection (510 in FIG. 11) between a conductive layer 532 of an RF module and a conductive layer of a functional component 130.

As described herein, the functional component 130 can include a device (active or passive) that is part of the module's RF design and therefore provides some RF-related function. A device such as a CSSD (chip size SAW (surface acoustic wave) device) filter can be such a functional component.

Figure 12A:
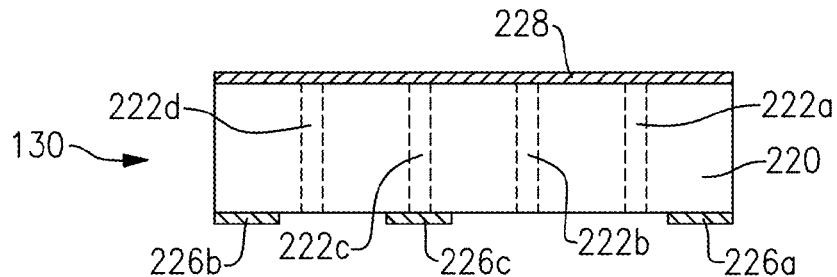
FIGS. 12A-12E show an example of how an opening formed through an overmold layer can allow formation of an electrical connection between a conductive layer of an RF module and a conductive layer of a shielding-component.

Similar to FIG. 10A, FIG. 12A depicts a sectional view of an example functional component 130. In the example shown, the functional component 130 is shown to be inverted so that a metal layer 228 is facing upward. Some or all of example through-die conductive vias 222a-222d can be electrically connected to the metal layer 228. Some of such through-die conductive vias can be electrically connected to one or more contact pads 226 formed on now-bottom-facing surface of the functional component 130. Some of such contact pads 226 can be electrically connected to a circuit formed within the functional component 130 (e.g., signal input, signal output, power).

Figure 12B:
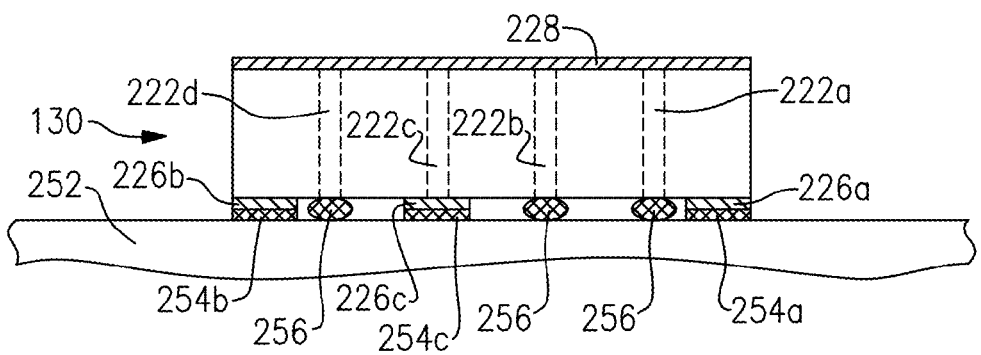

Similar to FIG. 10B, FIG. 12B shows a mounted configuration where the inverted die 130 is mounted on a packaging substrate 252. In some embodiments, the packaging substrate 252 can include contact pads (e.g., 254a, 254b, 254c) to facilitate physical mounting (e.g., by solders) and electrical connections with their respective contact pads (e.g., 226a, 226b, 226c) of the die. The contact pads 254a, 254b, 254c can be electrically connected to their respective module-terminals or module-ground through various connection features (not shown) within the packaging substrate 252 (e.g., a laminate substrate).

As further shown in FIG. 12B, the vias (e.g., 222a, 222b, 222d) that are not connected in the foregoing manner can be electrically grounded by, for example, ball joints 256 that are in turn electrically connected (not shown) to the module-ground. Accordingly, the metal layer 228 is electrically connected to the module ground through some or all of the conductive vias. In some embodiments, such a module-ground can include one or more ground planes that provide RF shielding functionality below the surface of the packaging substrate 252.

Figure 12C:
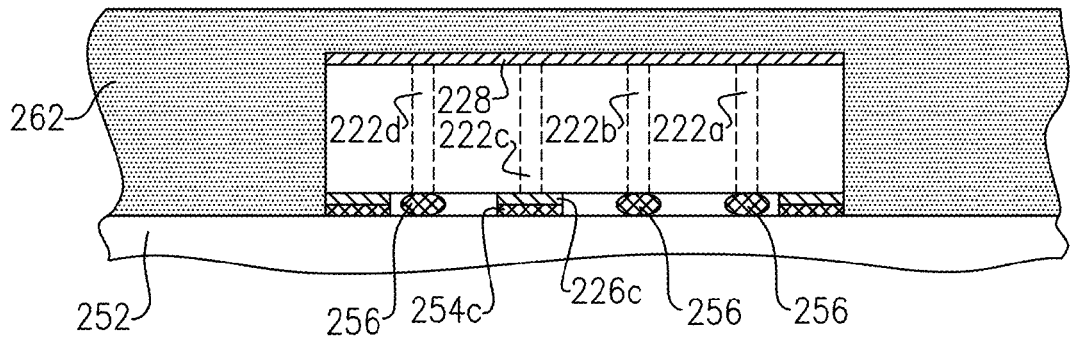

FIG. 12C shows an example configuration where an overmold 262 has been formed over the packaging substrate 252 and covers the metal layer 228 of the inverted die 130. Thus, for the example configuration shown in FIG. 12C, a conductive layer (not shown) formed over the overmold 262 will not be in direct electrical contact with the metal layer 228.

Figure 12D:
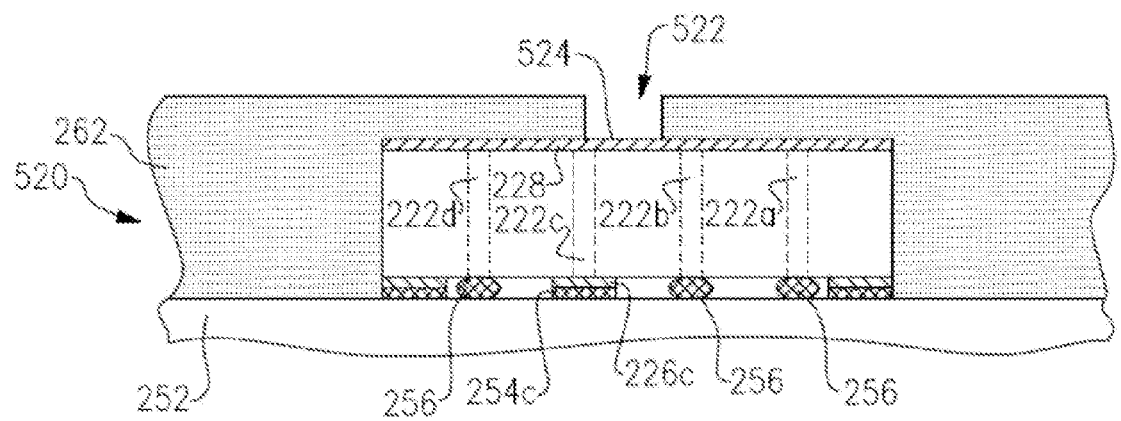

FIG. 12D shows an example configuration 520 where an opening 522 has been formed through a portion of the overmold 262 over the metal layer 228. The opening 522 can be formed so as to yield an exposed surface 524 on an upper portion of the metal layer 228. Such an opening can be formed utilizing a number of techniques, including, for example, laser drilling or ablation. An example of formation of such an opening by laser ablation is described herein in greater detail. Although described in such a context, it will be understood that other opening-formation techniques (e.g., mechanical drilling or chemical etching) can also be utilized.

Figure 12E:
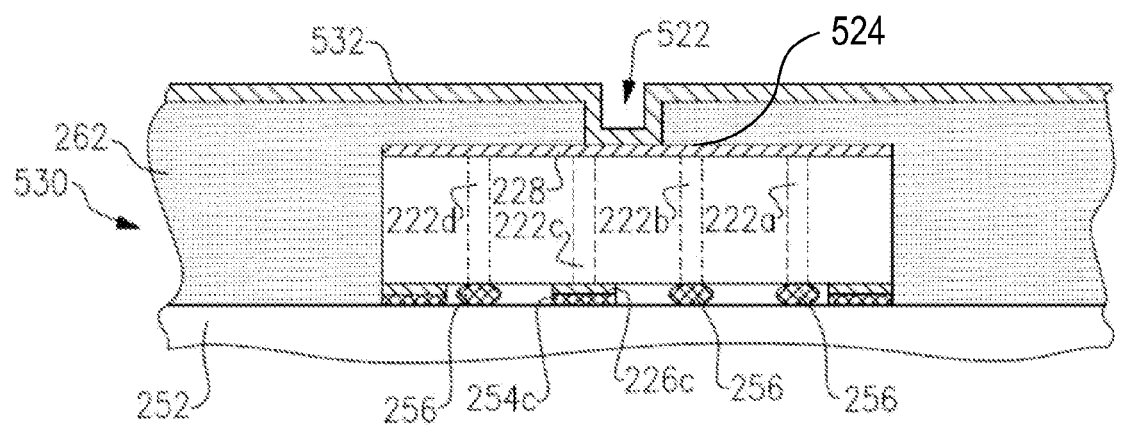

FIG. 12E shows an example configuration 530 where a conductive layer 532 has been formed over the overmold 262 and the opening 522. In some embodiments, the conductive layer 532 can provide contiguous coverage among a region around the opening 522, the wall of the opening 522, and the surface 524 of the metal layer 228 exposed by the opening 522. Accordingly, the conductive layer 532 as a whole can be in electrical contact with the metal layer 228, and thereby with the grounding plane (not shown) of the module.

Figure 13A:
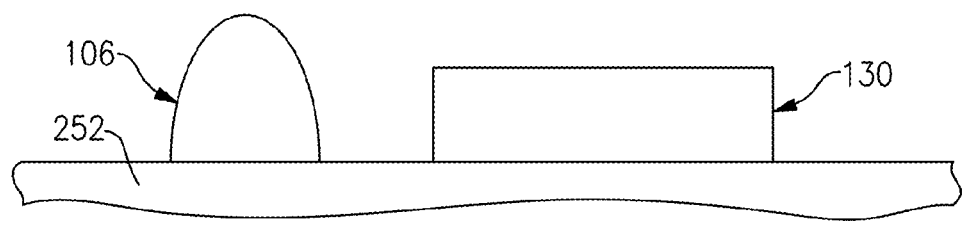
FIGS. 13A-13F show an example of how techniques such as laser ablation can be utilized to form an opening through an overmold to facilitate an electrical connection between a conductive layer of a module and a metal layer of a shielding-component.

FIGS. 13A-13F show an example of how laser ablation can be utilized to form an opening through an overmold to facilitate an electrical connection between a conductive layer of a module and a metal layer of a functional component. FIG. 13A shows an example configuration where a functional component 130 such as a filter device and a shielding-wirebond 106 are mounted on a packaging substrate 252. Although described in the context of both of the functional component 130 and the shielding-wirebond 106 being implemented together, it will be understood that one or more features associated with formation of the electrical connection through a portion of an overmold can also be implemented without the shielding-wirebond 106. It will also be understood that the functional component 130 includes an upper metal layer (e.g., 228 in FIG. 12).

Figure 13B:
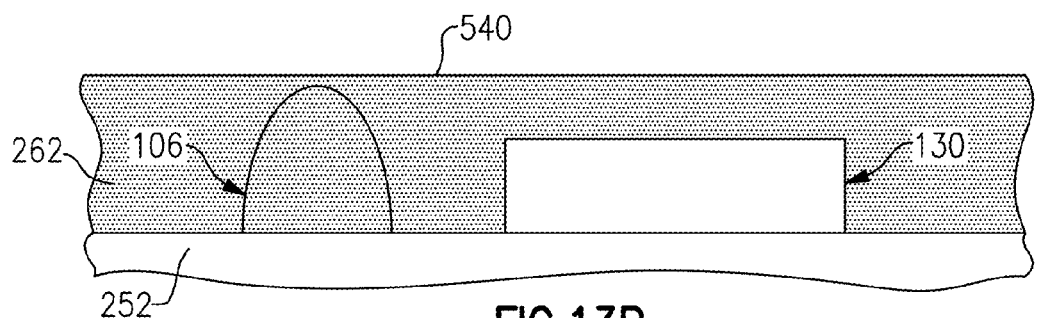

FIG. 13B shows an example stage of module fabrication where an overmold 262 has been formed over the packaging substrate 252. The overmold 262 is shown to substantially encapsulate the shielding-wirebond 106. An upper surface 540 of the overmold 262 may or may not expose a top portion (58 in FIG. 13C) of the shielding-wirebond 106.

In the example shown, the height of the shielding-wirebond 106 is greater than the height of the functional component 130. Accordingly, the overmold 262 is shown to cover the upper surface of the functional component 130.

Figure 13C:
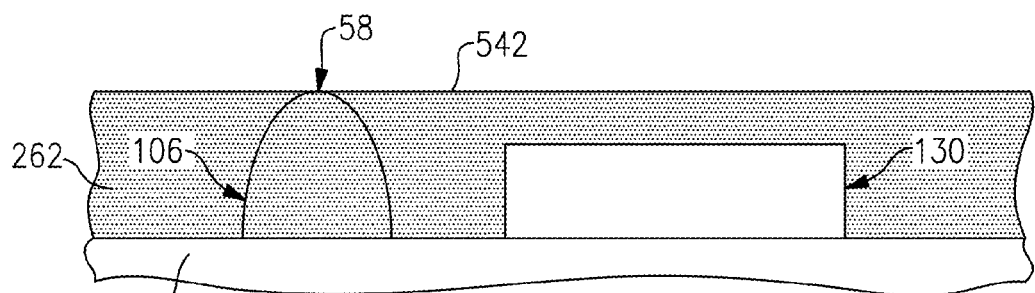

FIG. 13C shows an example stage where material has been removed from the upper surface (540 in FIG. 3B) so as to yield a new upper surface 542. The amount of material removed can be selected so that the top portion 58 of the shielding-wirebond 106 is exposed sufficiently to allow electrical connection with a conductive layer formed on the new upper surface 542. In some implementations, such removal of material can be achieved by micro-ablation.

Figure 13D:
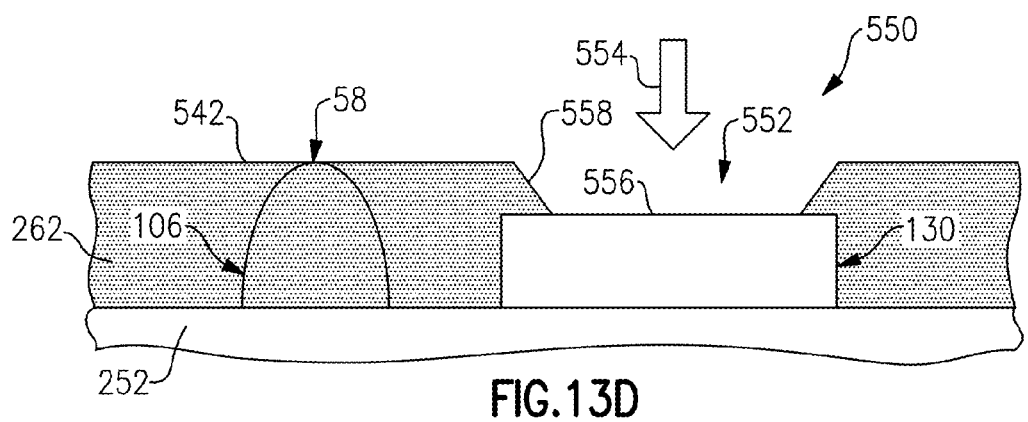

FIG. 13D shows a stage 550 where a laser beam 554 is applied to a region above the functional component 130 so as to ablate the overmold material and form an opening 552. In some implementations, the overmold material can include, for example, epoxy molding compounds (EMCs). For such an example material, a laser having a wavelength in a range of, for example, 355 nm to 1060 nm can be utilized to form the opening.

In some implementations, the laser beam 554 can be applied until an upper surface 556 (e.g., a metal layer) of the functional component 130 is exposed sufficiently to form an electrical connection. With the foregoing example laser, the beam at the operating power can generally reflect from the metal surface 556. Accordingly, likelihood of over-burn substantially into or through the metal layer can be reduced.

In some implementations, the laser beam 554 can be focused to provide, for example, a desired lateral beam size at the ablation location. Such a focused beam can have a conical shape, thereby resulting in the opening 552 having a chamfered wall that forms a greater-than-90-degree angle with the upper surface 542. Such a chamfered profile can facilitate an improved coverage of a conductive layer to be formed.

Figure 13E:
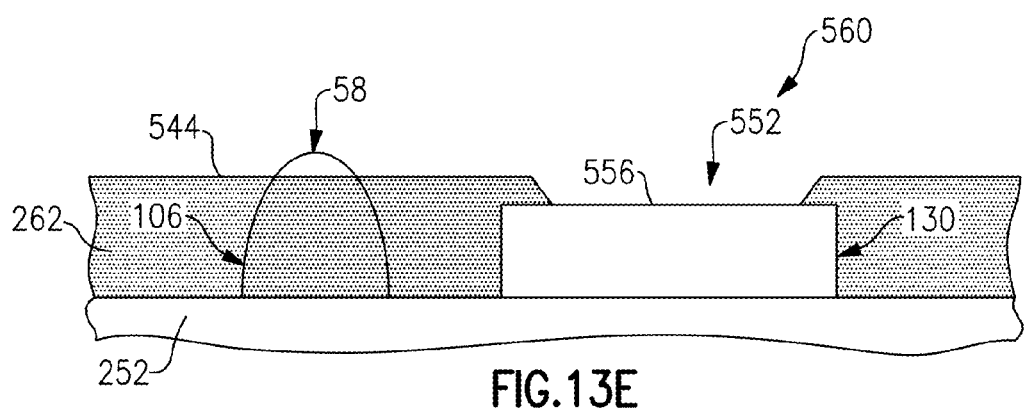

FIG. 13E shows an example stage 560 where the opening 552 formed by laser can be cleaned to, for example, remove laser-ablation residue on the surface 556. In some implementations, such cleaning can be achieved by micro-ablation similar to the micro-ablation example of FIG. 13C.

In some implementations, the entire module (and in situations where an array of modules are being fabricated in a panel, the entire panel) can be subjected to the micro-ablation process to clean the opening 552. Such an exposure to micro-ablation can result in overmold material being removed further so as to yield a new surface 544. In some implementations, about 1 to 5 μm of the overmold material can be removed during such a micro-ablation process.

In the example stages (FIGS. 13C and 13E) where micro-ablation processes are performed, it will be understood that the example figures are not necessarily drawn to scale. Thus, the micro-ablation process associated with FIG. 13E can remove more or less amount of the overmold material than that of FIG. 13C.

FIG. 13E shows that such further removal of overmold material further exposes the shielding-wirebond 106. In some implementations, such an increase in exposed portion of the shielding-wirebond 106 can facilitate an improved electrical connection with a conductive layer to be formed.

In some implementations, a rinse process can be implemented to remove residue from the micro-ablation process and to prepare the surfaces (544, 556) of the overmold 262 and the exposed metal layer of the functional component 130.

Figure 13F:
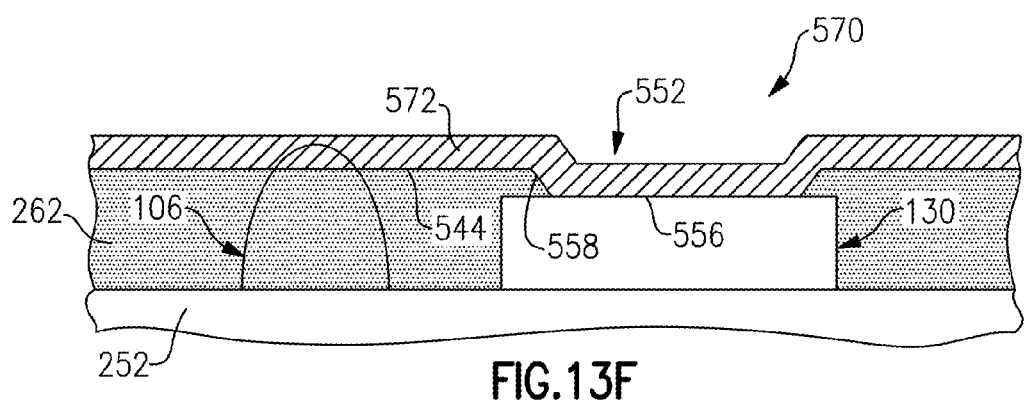

FIG. 13F shows an example stage 570 where a conductive layer 572 has been applied so as to substantially cover the overmold surface 544, the wall 558 of the opening 552, and the exposed metal surface 556 of the functional component 130. The conductive layer 572 is also shown to have covered the exposed upper portion of the shielding-wirebond 106. Thus, the conductive layer 572 is now electrically connected to the ground plane (not shown) through the shielding-wirebond 106 and the functional component 130.

In some implementations, the conductive layer 574 can include metallic paint applied by spraying. Various examples of such a metallic paint are described in greater detail in, for example, U.S. Patent Application Publication No. 2013/0335288, titled SEMICONDUCTOR PACKAGE HAVING A METAL PAINT LAYER the disclosure of which is incorporated herein by reference in its entirety.

Figure 14:
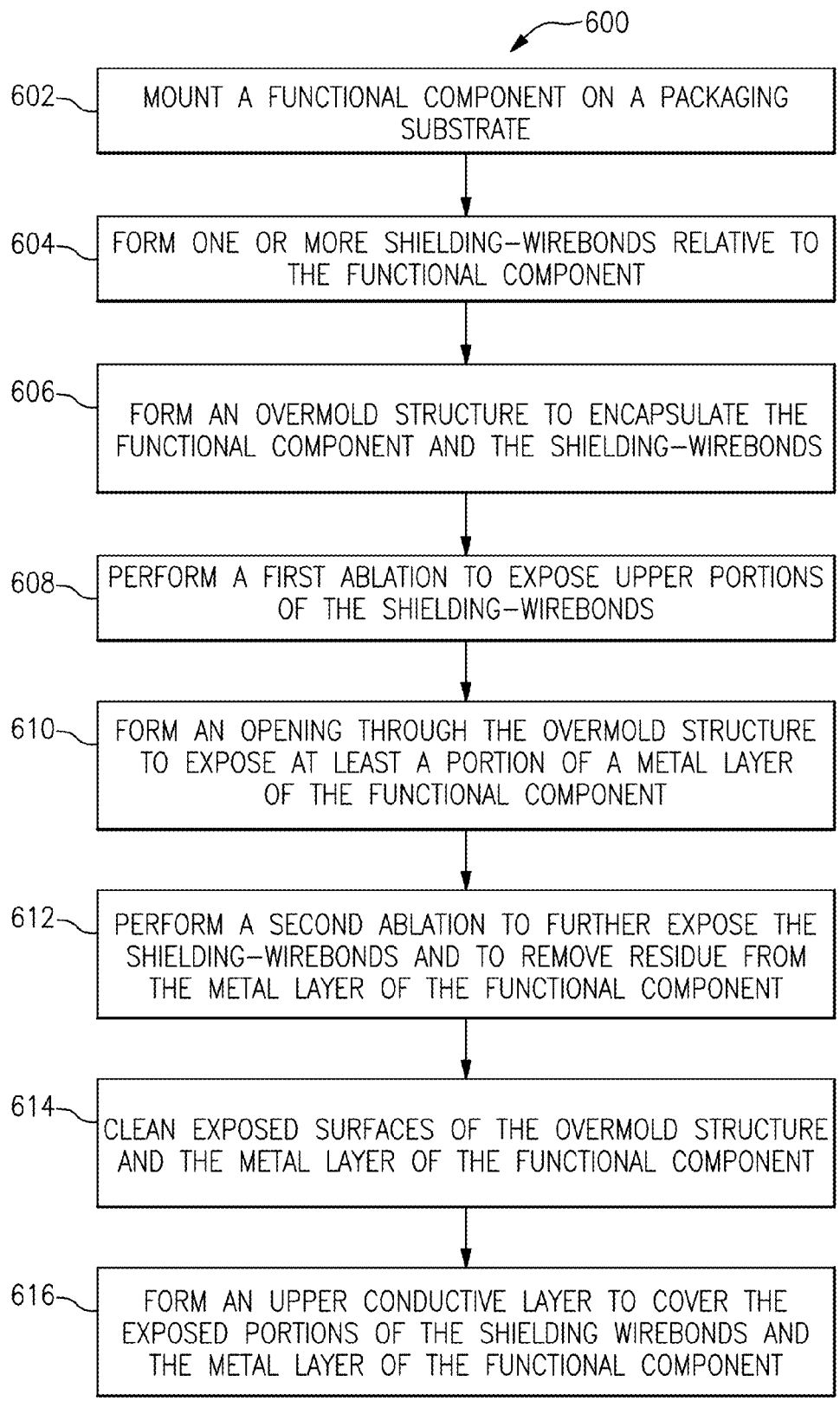
FIG. 14 shows a process that can be implemented to effectuate the example module-fabrication stages of FIGS. 13A-13F.

FIG. 14 shows a process 600 that can be implemented to effectuate the example module-fabrication stages described in reference to FIGS. 13A-13F. In block 602, a functional component can be mounted on a packaging substrate. In block 604, one or more shielding-wirebonds can be formed relative to the functional component. In block 606, an overmold structure can be formed to encapsulate the functional component and the shielding-wirebonds. In block 608, a first ablation process can be performed to expose upper portions of the shielding-wirebonds. In some implementations, such an ablation process can include a micro-ablation process. In block 610, an opening can be formed through the overmold to expose at least a portion of a metal layer of the functional component. In some implementations, such an opening can be formed by laser ablation. In block 612, a second ablation process can be performed to further expose the shielding-wirebonds and to remove residue from the surface of the exposed metal layer of the functional component. In some implementations, such an ablation process can include a micro-ablation process. In block 614, the exposed surfaces of the overmold and the metal layer surface can be can be cleaned. In block 616, an upper conductive layer can be formed to cover the exposed portions of the shielding-wirebonds and the exposed portion of the metal layer of the functional component. In some implementations, the upper conductive layer can be formed by spray-application of metallic paint.

In some implementations, additional details concerning some of the example stages of FIG. 13 and the process blocks of FIG. 14 can be found in U.S. Patent Application Publication No. 2013/0335288. It will be understood, however, that one or more features of the present disclosure can also be implemented with other configurations. For example, removal of overmold material does not necessarily need to be performed by micro-ablation. In another example, formation of the upper conductive layer does not necessarily need to be performed by spray-application of metallic paint.

In the various examples described herein, the openings (522 in FIGS. 12, and 552 in FIG. 13) are described in the context of one opening being formed over the functional component (130). It will be understood that more than one opening can be formed and utilized to facilitate more than one electrical connection between the upper conductive layer and the functional component. For example, if a given functional component has a relatively large lateral dimension, it may be desirable to form a plurality of such electrical connections.

Figure 15A:
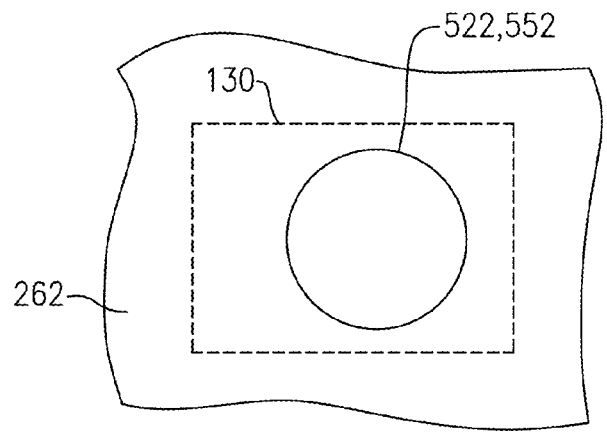
FIGS. 15A-15C show examples of arrangements of one or more openings that can be implemented to facilitate electrical connections as described herein.

FIG. 15A shows a plan view of a functional component 130 encapsulated by an overmold 262. One opening (522, 552) is shown to be formed so as to facilitate an electrical connection as described herein. Such an opening may or may not be centered with respect to the functional component 130.

Figure 15B:
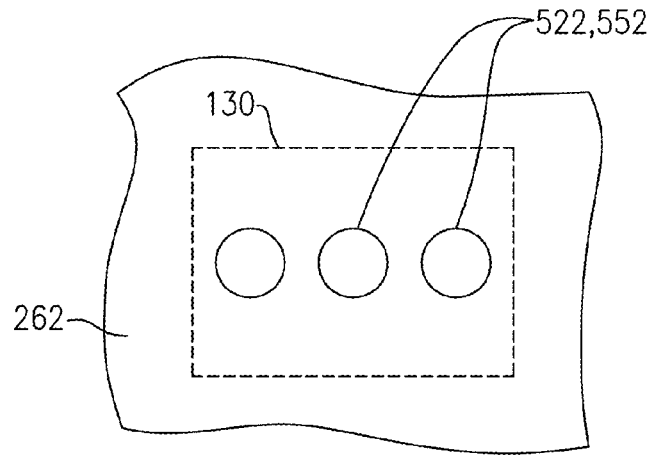

FIG. 15B shows an example configuration where a plurality of openings (522, 552) are formed over the functional component 130. In some embodiments, such openings can be generally aligned along a selected line.

Figure 15C:
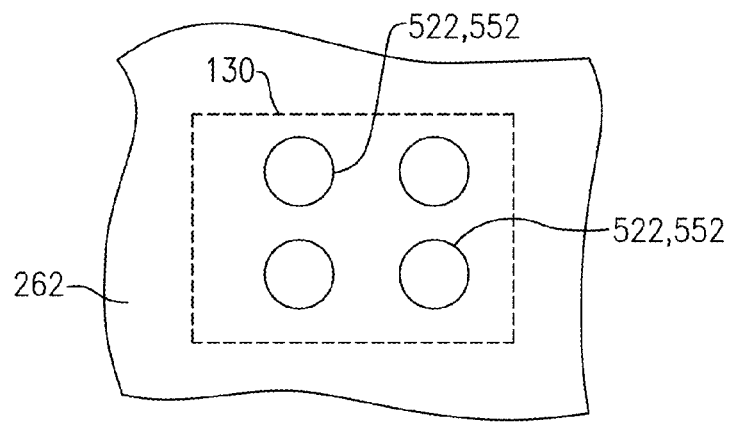

FIG. 15C shows that in some embodiments, a plurality of openings (522, 552) can also be arranged laterally in two dimensions. For example, the openings can be arranged in a two dimensional array.

In the various examples herein, a conformal conductive layer (e.g., 572 in FIG. 13F) and its contact with an exposed metal surface of an SMD (e.g., 130) are described in the context of formation of an electrical conduction path to facilitate the grounding path between the conformal conductive layer and a ground plane of the packaging substrate. However, it will be understood that one or more features associated with such a conformal layer formed so as to be in contact with an upper surface of the SMD can also be utilized to provide other conduction paths between the SMD and the conformal layer. For example, heat can be transferred from the SMD through its upper surface and to the conformal layer through conduction. In such an application, either or both of the conformal layer and the upper surface of the SMD can be configured to provide good thermal conduction properties, and may or may not include electrical conduction properties.

For the purpose of description herein, a surface mount device (SMD) can include any device mountable on a substrate such as a packaging substrate utilizing various surface mount technologies. In some embodiments, an SMD can include any device mountable on a packaging substrate and having an upper surface. In some embodiments, such an upper surface can be larger than an upper portion of a curved wirebond. An SMD can include active and/or passive components; and such components can be configured for RF and/or other applications. Such an SMD is also referred to herein as, for example, an RF component, a component, a filter, a CSSD, a shielding-component, a functional component, and the like. It will be understood that such terms can be used interchangeably in their respective contexts.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 16:
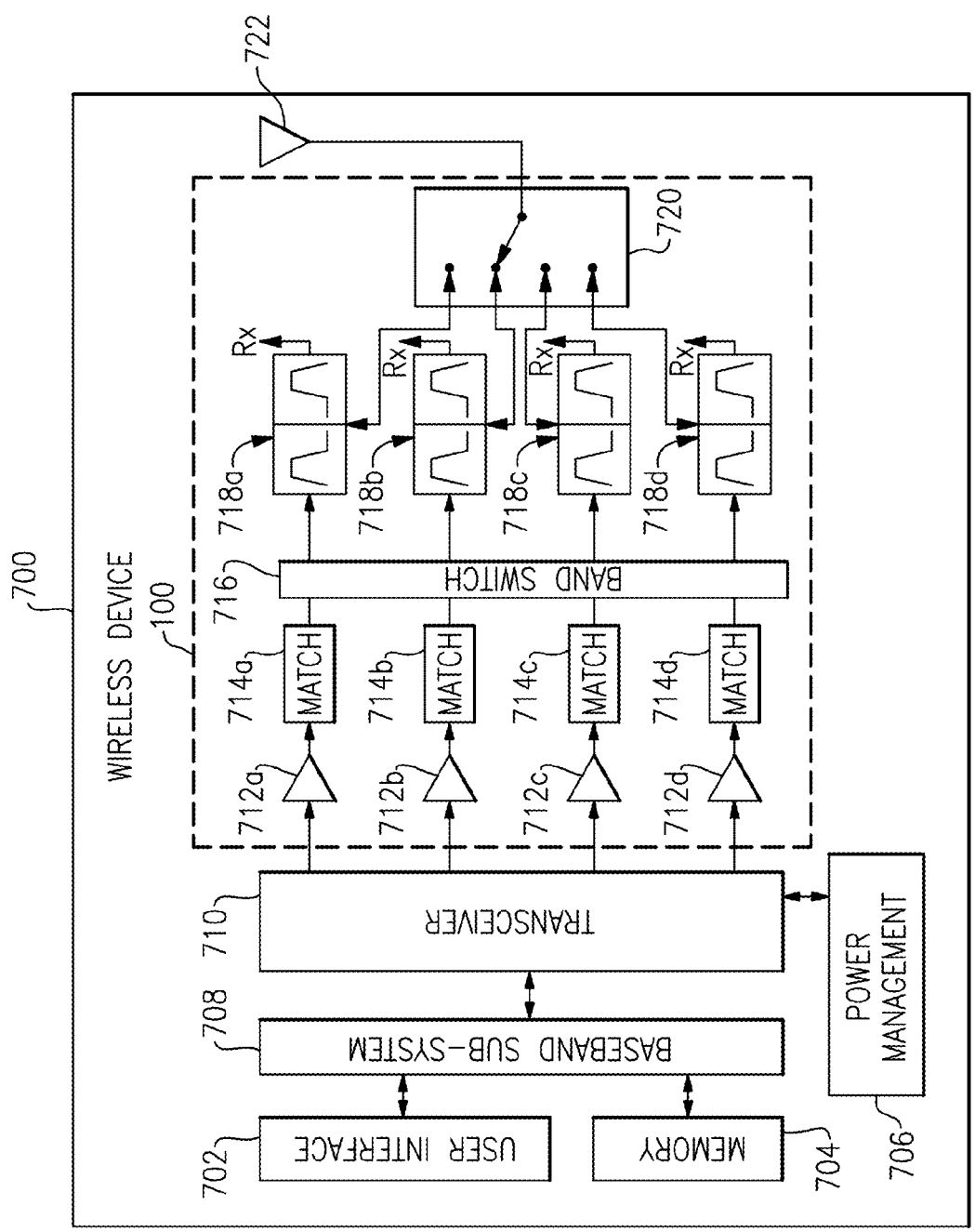
FIG. 16 depicts an example wireless device having one or more advantageous features as described herein.

FIG. 16 depicts an example wireless device 700 having one or more advantageous features described herein. In the context of a module having one or more features as described herein, such a module can be generally depicted by a dashed box 100, and can be implemented as a front-end module (FEM). Other modules in the wireless device 700 can also benefit from implementation of one or more features as described herein.

PAs 712 can receive their respective RF signals from a transceiver 710 that can be configured and operated to generate RF signals to be amplified and transmitted, and to process received signals. The transceiver 710 is shown to interact with a baseband sub-system 708 that is configured to provide conversion between data and/or voice signals suitable for a user and RF signals suitable for the transceiver 710. The transceiver 710 is also shown to be connected to a power management component 706 that is configured to manage power for the operation of the wireless device. Such power management can also control operations of the baseband sub-system 708 and the module 100.

The baseband sub-system 708 is shown to be connected to a user interface 702 to facilitate various input and output of voice and/or data provided to and received from the user. The baseband sub-system 708 can also be connected to a memory 704 that is configured to store data and/or instructions to facilitate the operation of the wireless device, and/or to provide storage of information for the user.

In the example wireless device 700, outputs of the PAs 712 are shown to be matched (via respective match circuits 714) and routed to an antenna 722 through a band selection switch 716, their respective duplexers 718 and an antenna switch 720. In some embodiments, each duplexer 718 can allow transmit and receive operations to be performed simultaneously using a common antenna (e.g., 722). In FIG. 16, received signals are shown to be routed to "Rx" paths (not shown) that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for fabricating a radio-frequency (RF) module, the method comprising:
providing a packaging substrate configured to receive a plurality of components, the packaging substrate including a ground plane;
mounting a surface mount device (SMD) on the packaging substrate, the SMD including a metal layer that faces upward when mounted and the SMD including an RF filter;
forming an overmold over the packaging substrate, the overmold covering the SMD;
forming an opening through the overmold at a region over the SMD to expose at least a portion of the metal layer; and
forming a conductive layer over the overmold, the conductive layer filling at least a portion of the opening to provide an electrical path between the conductive layer, the metal layer of the SMD, and the ground plane.

2. The method of claim 1 wherein forming of the opening includes ablating the overmold with a laser.

3. The method of claim 1 wherein forming of the conductive layer includes applying metallic paint.

4. The method of claim 1 further comprising forming, prior to forming of the overmold, a shielding-wirebond on the packaging substrate.

5. The method of claim 4 wherein the shielding-wirebond has a height that is greater than the height of the SMD.

6. The method of claim 5 wherein the overmold has a height that is substantially equal to or greater than the height of the shielding-wirebond.

7. The method of claim 6 further comprising removing, prior to forming of the opening, an upper portion of the overmold to expose a top portion of the shielding-wirebond but still cover the SMD.

8. The method of claim 7 wherein removing of the upper portion of the overmold includes an ablation process.

9. The method of claim 8 wherein the ablation process includes a micro-ablation process.

10. The method of claim 8 further comprising removing, after forming of the opening, residue resulting from the formation of the opening.

11. The method of claim 10 wherein removing of the residue also results in additional material being removed from the overmold to thereby further expose the shielding-wirebond.

12. The method of claim 10 wherein removing of the residue includes an ablation process.

13. The method of claim 12 wherein the ablation process includes a micro-ablation process.

14. The method of claim 10 further comprising cleaning, prior to forming of the conductive layer, the exposed surfaces of the overmold and the metal layer of the SMD.

15. A radio-frequency (RF) module comprising:
a packaging substrate configured to receive a plurality of components, the packaging substrate including a ground plane;
a surface mount device (SMD) mounted on the packaging substrate, the SMD including a metal layer that faces upward when mounted and the SMD including an RF filter;
an overmold formed over the packaging substrate, the overmold dimensioned to cover the SMD;
an opening defined by the overmold at a region over the SMD, the opening having a depth sufficient to expose at least a portion of the metal layer; and
a conductive layer formed over the overmold, the conductive layer configured to fill at least a portion of the opening to provide an electrical path between the conductive layer, the metal layer of the SMD, and the ground plane.

16. The RF module of claim 15 wherein the RF filter is formed on a die.

17. The RF module of claim 16 wherein the RF filter includes a contact feature on a side opposite from the metal layer, the contact feature electrically connected to the metal layer and also to a ground plane of the packaging substrate, such that the conductive layer above the overmold is electrically connected to the ground plane through the RF filter.

18. The RF module of claim 15 wherein the opening includes a side wall having a chamfer profile such that an angle between the side wall and a surface of the overmold has a value greater than 90 degrees to thereby facilitate an improved conformity as the conductive layer transitions between the opening and the surface of the overmold.

19. The RF module of claim 18 wherein the conductive layer includes a layer formed by metallic paint.

20. A wireless device comprising:
an antenna; and
a module in communication with the antenna, the module configured to facilitate either or both of transmission and reception of RF signals through the antenna, the module including a packaging substrate configured to receive a plurality of components, the packaging substrate including a ground plane, the module further including a surface mount device (SMD) mounted on the packaging substrate, the SMD including a metal layer that faces upward when mounted and the SMD including an RF filter, the module further including an overmold formed over the packaging substrate, the overmold dimensioned to cover the SMD, the module further including an opening defined by the overmold at a region over the SMD, the opening having a depth sufficient to expose at least a portion of the metal layer, the module further including a conductive layer formed over the overmold, the conductive layer configured to fill at least a portion of the opening to provide an electrical path between the conductive layer, the metal layer of the SMD, and the ground plane.

* * * * *